US012812932B2

(12) United States Patent
Lin et al.

(10) Patent No.: US 12,812,932 B2
(45) Date of Patent: Nov. 24, 2026

(54) TRANSITION BETWEEN DIFFERENT ACTIVE REGIONS

(71) Applicant: Taiwan Semiconductor Manufacturing Company, Ltd., Hsinchu (TW)

(72) Inventors: Po-Shao Lin, Taipei City (TW); Jiun-Ming Kuo, Taipei City (TW); Yuan-Ching Peng, Hsinchu (TW); You-Ting Lin, Miaoli County (TW); Yu Mei Jian, Nantou County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 739 days.

(21) Appl. No.: 18/159,989

(22) Filed: Jan. 26, 2023

(65) Prior Publication Data

US 2024/0120376 A1 Apr. 11, 2024

Related U.S. Application Data

(60) Provisional application No. 63/413,447, filed on Oct. 5, 2022.

(51) Int. Cl.
*H10D 62/10* (2025.01)
*H10D 30/67* (2025.01)
(Continued)

(52) U.S. Cl.
CPC ....... *H10D 62/121* (2025.01); *H10D 30/6735* (2025.01); *H10D 30/6757* (2025.01);
(Continued)

(58) Field of Classification Search
CPC ............. H10D 62/121; H10D 30/6735; H10D 30/6757; H10D 64/017; H10D 64/018;
(Continued)

(56) References Cited

U.S. PATENT DOCUMENTS

2008/0157192 A1* 7/2008 Pang .................... H10D 64/519 257/334
2012/0025316 A1* 2/2012 Schultz ................ H10D 86/215 257/E21.409
(Continued)

FOREIGN PATENT DOCUMENTS

DE 102007048982 A1 7/2008
EP 3930004 A1 12/2021
(Continued)

*Primary Examiner* — Brian Turner
*Assistant Examiner* — Zhijun Xu
(74) *Attorney, Agent, or Firm* — HAYNES AND BOONE, LLP

(57) ABSTRACT

Semiconductor structures and methods are provided. A semiconductor structure according to the present disclosure includes a first active region extending lengthwise along a first direction and having a first width along a second direction perpendicular to the first direction, a second active region extending lengthwise along the first direction and having a second width along the second direction, and an epitaxial feature sandwiched between the first active region and the second active region along the first direction. The first width is greater than the second width.

20 Claims, 30 Drawing Sheets

(51) Int. Cl.
*H10D 64/01* (2025.01)
*H10D 84/01* (2026.01)
*H10D 84/03* (2025.01)

(52) U.S. Cl.
CPC ......... *H10D 64/017* (2025.01); *H10D 64/018* (2025.01); *H10D 84/0128* (2025.01); *H10D 84/0158* (2025.01); *H10D 84/038* (2025.01)

(58) Field of Classification Search
CPC ........... H10D 84/0128; H10D 84/0158; H10D 84/038; H10D 30/014; H10D 30/43; H10D 62/151; H10D 84/83; H10D 89/10; H10D 84/013; H10D 84/0133; H10D 84/834
See application file for complete search history.

(56) References Cited

U.S. PATENT DOCUMENTS

| | | | | |
|---|---|---|---|---|
| 2014/0175379 | A1 | 6/2014 | Chu-Kung | |
| 2020/0266060 | A1* | 8/2020 | Cheng | H10D 64/017 |
| 2021/0126097 | A1 | 4/2021 | Ju | |
| 2021/0184015 | A1 | 6/2021 | Ching | |
| 2022/0068716 | A1 | 3/2022 | Pan | |
| 2022/0093588 | A1 | 3/2022 | Subramanian | |
| 2022/0238385 | A1 | 7/2022 | Chang | |

FOREIGN PATENT DOCUMENTS

| | | | |
|---|---|---|---|
| KR | 20220029359 | A | 3/2022 |
| KR | 20220085805 | A | 6/2022 |
| TW | 202109629 | A | 3/2021 |
| TW | 202113965 | A | 4/2021 |
| TW | 202209680 | A | 3/2022 |

* cited by examiner

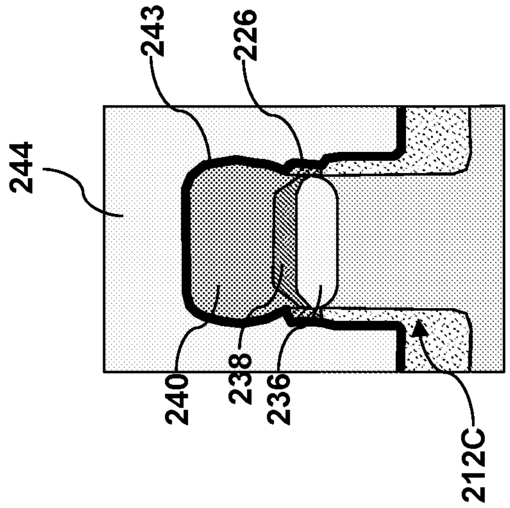
Fig. 24
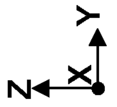

TRANSITION BETWEEN DIFFERENT ACTIVE REGIONS

PRIORITY DATA

This application claims priority to U.S. Provisional Patent Application No. 63/413,447, filed Oct. 5, 2022, the entirety of which is hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate metal-oxide-semiconductor field effect transistor (multi-gate MOSFET, or multi-gate devices) have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Multi-bridge-channel (MBC) transistors are examples of multi-gate devices that have become popular and promising candidates for high performance and low leakage applications. An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. While existing MBC transistor structures are generally adequate to their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2-29 illustrate fragmentary top or cross-sectional views of a workpiece during a fabrication process according to the method of FIG. 1, according to one or more aspects of the present disclosure.

DETAILED DESCRIPTION

Figure 1:
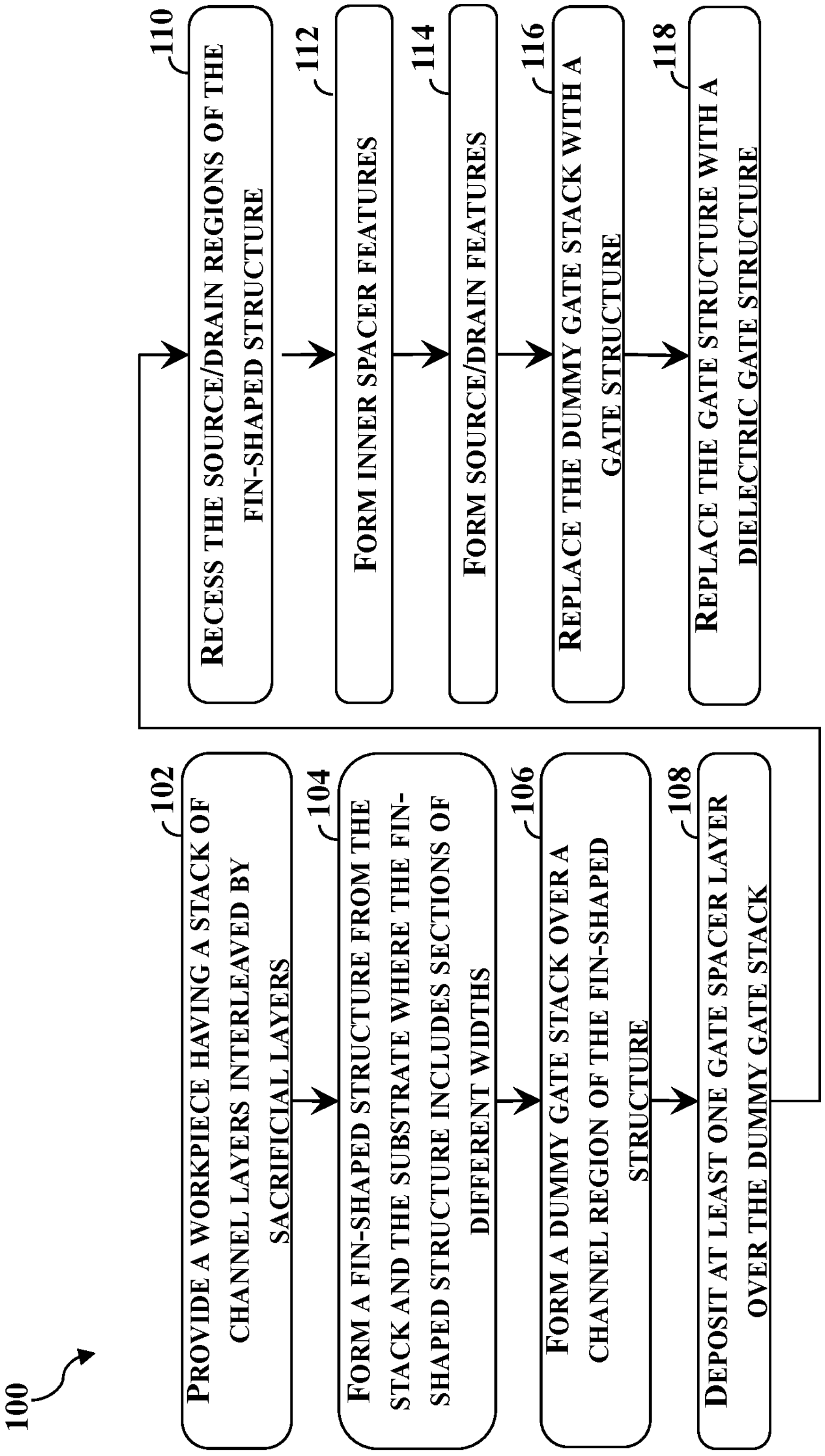
FIG. 1 illustrates a flowchart of a method for forming a semiconductor device, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with “about,” “approximate,” and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of “about 5 nm” can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to multi-gate transistors and fabrication methods, and more particularly to active regions of MBC transistors. Channel regions of an MBC transistor may be disposed in nanowire channel members, bar-shaped channel members, nanosheet channel members, nanostructure channel members, column-shaped channel members, post-shaped channel members, and/or other suitable channel configurations. Depending on the shapes of the channel members, MBC transistors may also be referred to as nanowire transistors or nanosheet transistors. Dimensions of the active regions determine the operational characteristics of an MBC transistor. In general, a narrow or small active region tends to provide low leakage current and low power consumption while a wide/large active region tends to provide high drive current and faster switching speed. The former may be more suitable for logic circuit and memory circuit and the latter may be more suitable for high performance or power circuit. In an existing scheme, MBC transistor active regions over a wafer all extend along a direction and have the same width. That usually means, MBC transistors are usually fabricated on different wafers and packaged in different dies. Substantial electrical routing may be needed to connect a small active region MBC transistor device and a large active region MBC transistor. Such electrical routing may result in substantial resistive capacitive delay (RC delay), which may impact the overall performance.

The present disclosure provides an active region that includes a wide region and a narrow region connected by a padding structure. With high performance, high drive current or fast-switching devices fabricated on the wide region and low leakage devices fabricated on the narrow region, long electrical routing and substantial RC delay may be avoided.

The various aspects of the present disclosure will now be described in more detail with reference to the figures. In that regard, FIG. 1 is a flowchart illustrating a method 100 of forming a semiconductor structure from a workpiece according to embodiments of the present disclosure. Method 100 is merely an example and is not intended to limit the present disclosure to what is explicitly illustrated in method 100. Additional steps can be provided before, during and after the method 100, and some steps described can be replaced, eliminated, or moved around for additional embodiments of the method. Not all steps are described herein in detail for reasons of simplicity. Method 100 is described below in conjunction with FIG. 2-28, which are fragmentary cross-sectional views, top views and perspective views of workpiece 200 at different stages of fabrication according to embodiments of the method 100 in FIG. 1. Because the workpiece 200 will be fabricated into a semiconductor structure or a semiconductor device, the workpiece 200 may be referred to herein as a semiconductor structure or a semiconductor device 200 as the context requires. For avoidance of doubts, the X, Y and Z directions in FIGS. 2-28 are perpendicular to one another. Throughout the present disclosure, unless expressly otherwise described, like reference numerals denote like features.

Figure 2:
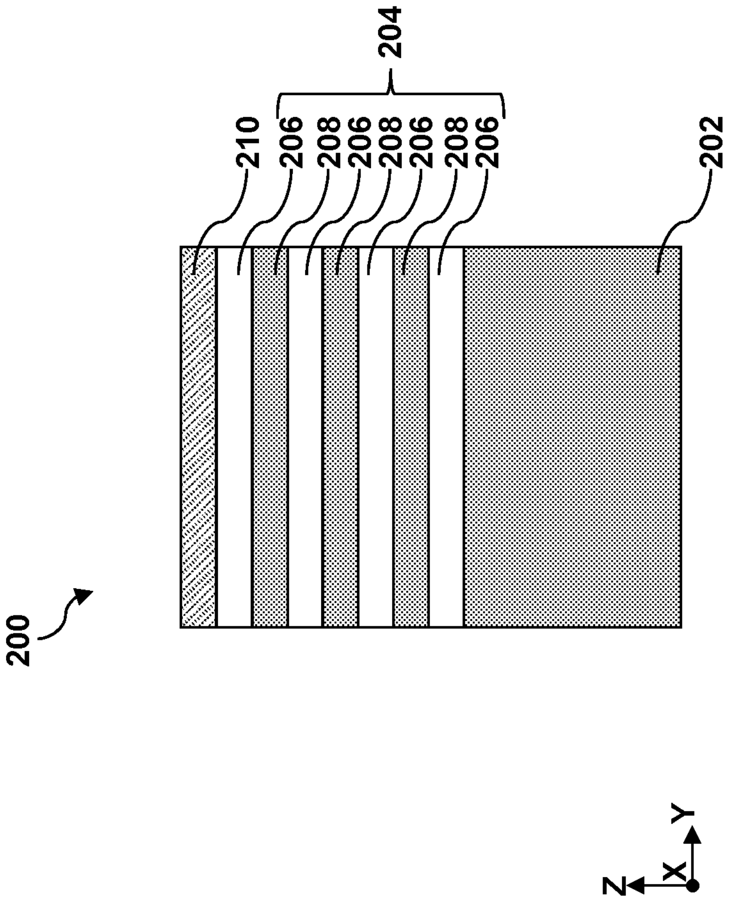

Referring to FIGS. 1 and 2, method 100 includes a block 102 where a stack 204 of alternating semiconductor layers is formed over a substrate 202. As shown in FIG. 2, the substrate 202 and the stack 204 may be collectively referred to as a workpiece 200. In some embodiments, the substrate 202 may be a semiconductor substrate such as a silicon (Si) substrate. The substrate 202 may include various doping configurations depending on design requirements as is known in the art. In embodiments where the semiconductor device is p-type, an n-type doping profile (i.e., an n-type well or n-well) may be formed on the substrate 202. In some implementations, the n-type dopant for forming the n-type well may include phosphorus (P) or arsenic (As). In embodiments where the semiconductor device is n-type, a p-type doping profile (i.e., a p-type well or p-well) may be formed on the substrate 202. In some implementations, the p-type dopant for forming the p-type well may include boron (B) or boron difluoride ($BF_2$). The suitable doping may include ion implantation of dopants and/or diffusion processes. The substrate 202 may also include other semiconductors such as germanium (Ge), silicon carbide (SiC), silicon germanium (SiGe), germanium tin (GeSn), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) or a germanium-on-insulator (GeOI) structure, and/or may have other suitable enhancement features.

In some embodiments, the stack 204 includes sacrificial layers 206 of a first semiconductor composition interleaved by channel layers 208 of a second semiconductor composition. The first and second semiconductor composition may be different. In some embodiments, the sacrificial layers 206 include silicon germanium (SiGe) or germanium tin (GeSn) and the channel layers 208 include silicon (Si). It is noted that four (4) layers of the sacrificial layers 206 and three (3) layers of the channel layers 208 are alternately arranged as illustrated in FIG. 2, which is for illustrative purposes only and not intended to be limiting beyond what is specifically recited in the claims. It can be appreciated that any number of epitaxial layers may be formed in the stack 204. The number of layers depends on the desired number of channels members for the semiconductor device 200. In some embodiments, the number of channel layers 208 is between 2 and 10.

In some embodiments, all sacrificial layers 206 may have a substantially uniform first thickness and all of the channel layers 208 may have a substantially uniform second thickness. The first thickness and the second thickness may be identical or different. As described in more detail below, the channel layers 208 or parts thereof may serve as channel member(s) for a subsequently-formed multi-gate device and the thickness of each of the channel layers 208 is chosen based on device performance considerations. The sacrificial layers 206 in channel regions(s) may eventually be removed and serve to define a vertical distance between adjacent channel members, which are formed from the channel layers 208, for a subsequently-formed multi-gate device and the thickness of each of the sacrificial layers 206 is chosen based on device performance considerations.

The sacrificial layers 206 and channel layers 208 in the stack 204 may be deposited using a molecular beam epitaxy (MBE) process, a vapor phase deposition (VPE) process, and/or other suitable epitaxial growth processes. As stated above, in at least some examples, the sacrificial layers 206 include an epitaxially grown silicon germanium (SiGe) layer and the channel layers 208 include an epitaxially grown silicon (Si) layer. In some embodiments, the sacrificial layers 206 and the channel layers 208 are substantially dopant-free (i.e., having an extrinsic dopant concentration from about 0 atoms/cm 3 to about $1\times10^{17}$ atoms/$cm^3$), where for example, no intentional doping is performed during the epitaxial growth processes for the stack 204. In some alternative embodiments, the sacrificial layers 206 may include silicon germanium (SiGe) and the channel layers 208 include silicon (Si).

Figure 3:
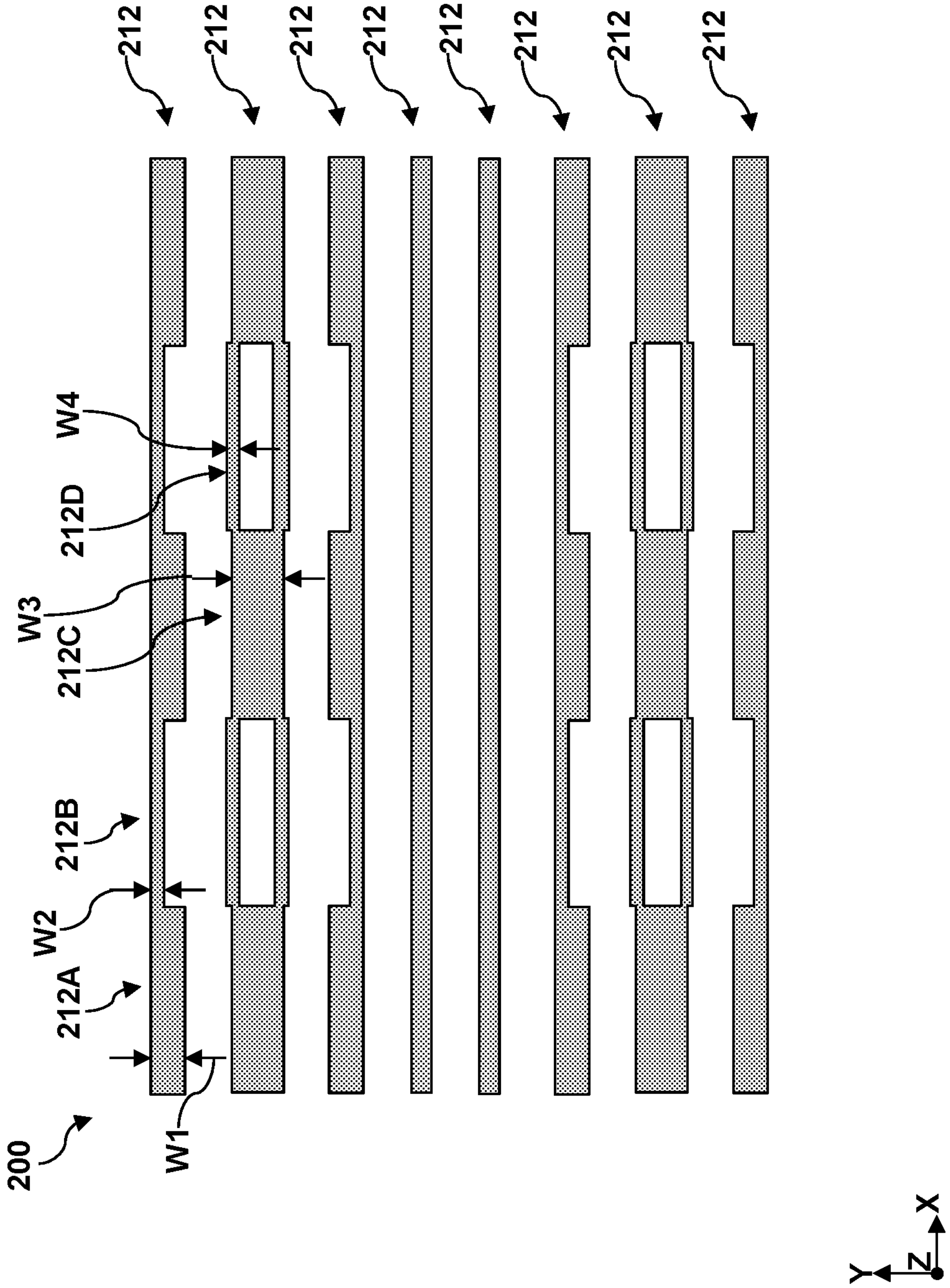

Referring still to FIGS. 1 and 3-8, method 100 includes a block 104 where a fin-shaped structure 212 is formed from the stack 204 and a portion of the substrate 202. The fin-shaped structure 212 includes a first section and a second section that have different widths. FIG. 3 is a schematic top view of fin-shaped structures 212 as designed in a computer-aided design environment. In other words, FIG. 3 is representative of fin-shaped structures 212 in a GDSII file format. In FIG. 3, the fin-shaped structures 212 extend lengthwise along a first direction (i.e., the X direction in FIG. 3) and may include sections having different widths along a second direction (i.e., the Y direction in FIG. 3). In the embodiments represented in FIG. 3, the fin-shaped structures 212 may include a first section 212A, a second section 212B, a third section 212C, and a fourth section 212D. As illustrated in FIG. 3, a first section 212A may transition into a second section 212B and vice versa and a third section 212C may transition into two fourth sections 212D or vice versa. While not explicitly shown in FIG. 3, a third section 212C may transition into two second sections 212B or vice versa. The first section 212A, the second section 212B, the third section 212C, and the fourth section 212D may have different widths along the Y direction. These different widths allow designers latitude to apply wider sections for high-speed or high-current applications and narrower sections for power conservation. In some embodiments, the implementation of different width sections may be planned and optimized by using a circuit design simulation software. In FIG. 3, the first section 212A has a first width W1, the second section 212B has a second width W2, the third section 212C has a third width W3, and the fourth section 212D has a fourth width W4. In the depicted embodiments, the third width W3 is greater than the first width W1, the first width W1 is greater than the second width W2, and the second width W2 is greater than the fourth width W4. In some instances, the first width W1 may be between about 30 nm and about 50 nm, and the third width W3 may be between about 50 nm and about 90 nm, and the second width W2 and the fourth width W4 may be between about 10 nm and about 40 nm.

Figure 4:
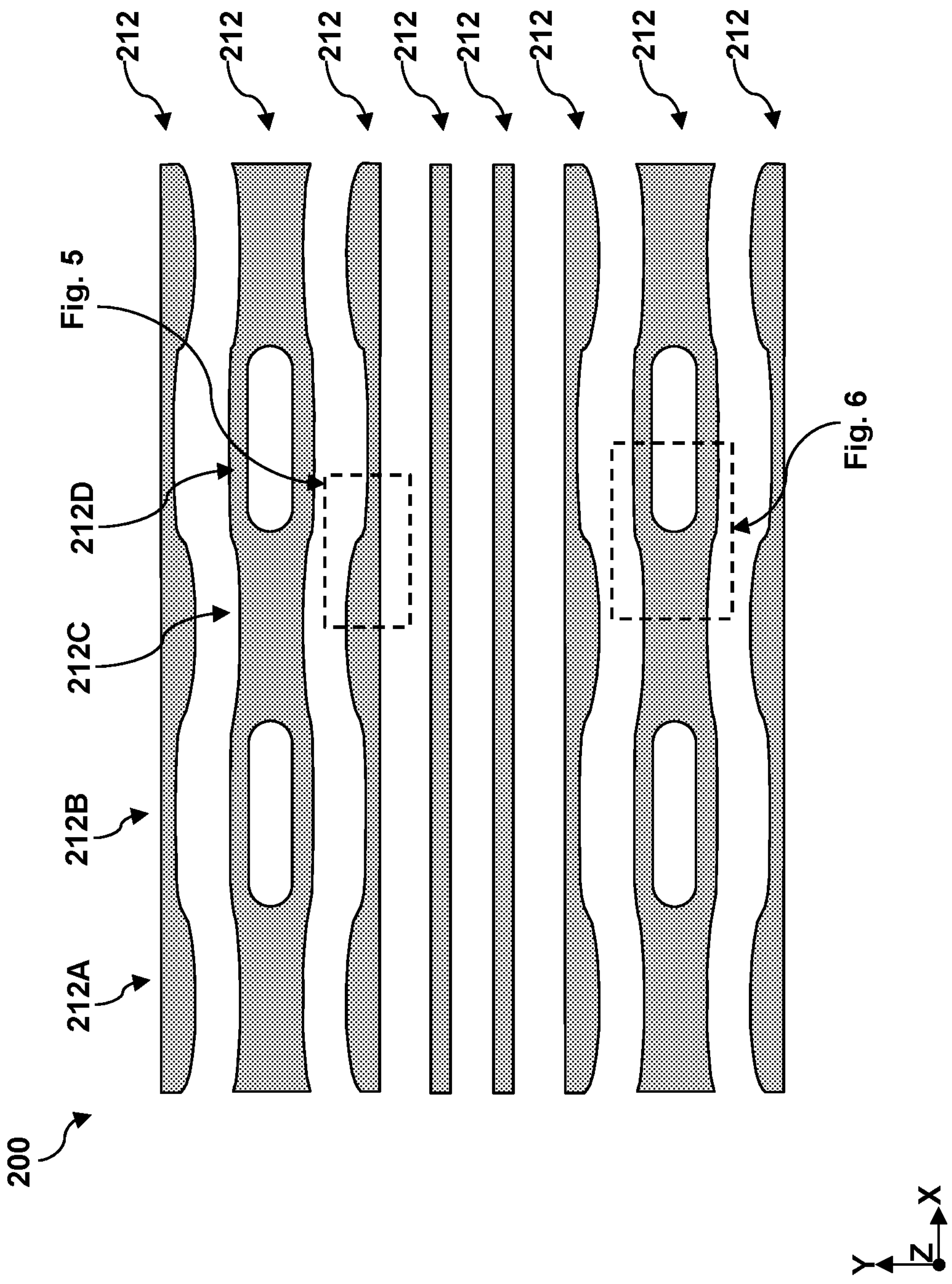

FIG. 4 is a schematic top view of fin-shaped structures 212 as fabricated on the workpiece 200. A GDSII design file representatively shown in FIG. 3 may undergo optical proximity correction (OPC) and sub-resolution assist feature (SRAF) insertion before a photolithography mask is fabricated according to the modified design. The mask is then applied in a photolithography process to pattern the stack 204 and a portion of the substrate 202. Due to the different widths of the sections in the fin-shaped structures 212, multiple patterning techniques may or may not be used to pattern the fin-shaped structures 212 shown in FIG. 4. In some embodiments, the fin-shaped structures 212 shown in FIG. 4 may be patterned using extreme ultraviolet (EUV) photolithography techniques. The transitions among different sections of the fin-shaped structures 212 in FIG. 4 include gradual width change do not include stepwise width change shown in FIG. 3. The transitions among different sections will be described in more detail below with reference to enlarged views shown in FIGS. 5 and 6.

Figure 5:
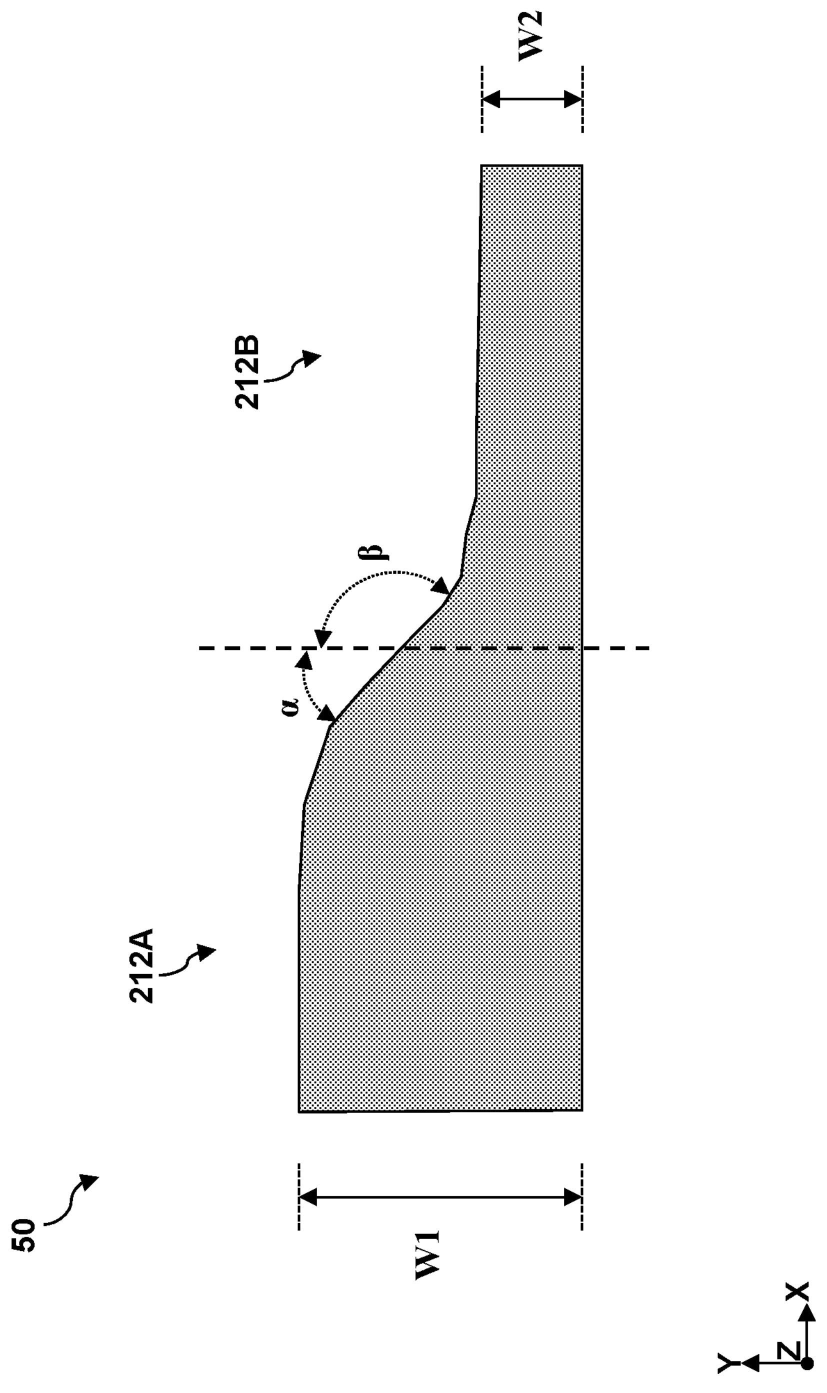

FIG. 5 illustrates an enlarged view of an L-shaped transition portion 50 from a first section 212A to a second section 212B. As shown in FIG. 5, the first section 212A continuously transitions to the second section 212B in the L-shaped transition portion 50. A lengthwise edge of the first section 212A is aligned with a lengthwise edge of the second section 212B. In the implementations shown in FIG. 5, a bottom edge of the first section 212A is aligned with a bottom edge of the second section 212B. The upper edge of the first section 212A transitions to the upper edge of the second section 212B by way of a slope transition, which allows the first section 212A to have the first width W1 and the second section 212B to have the second width W2. The slope transition is characterized by a first angle $\alpha$ adjacent the first section 212A and a second angle $\beta$ adjacent the second section 212B. To reduce defects in epitaxial features in a subsequent operation, the first angle $\alpha$ may be between 60° and about 75° and the second angle $\beta$ is an obtuse angle, such as between about 105° and about 120°. A sum of the first angle $\alpha$ and the second angle $\beta$ is about 180°. These angle ranges are not trivial. When a replacement gate process (also known as a gate-last process) is adopted, a polysilicon dummy gate stack may be formed along the dotted line at the interface between the first section 212A and the second section 212B. When the first angle $\alpha$ is less than 60°, the patterning of a polysilicon dummy gate stack may leave residual polysilicon in the acute angle corner, which prevents satisfactory formation of gate spacers. During a subsequent gate replacement process where the polysilicon dummy gate stack is removed to make room for a metal gate structure, the etchant may etch through the polysilicon in the acute angle corner to damage the source/drain feature. When the first angle $\alpha$ is greater than 60°, the probability of undesirable residual polysilicon is substantially reduced. It is noted that the metal gate structure formed along the dotted line will be removed and replaced with a dielectric gate structure to isolate the first section 212A and the second section 212B.

Figure 6:
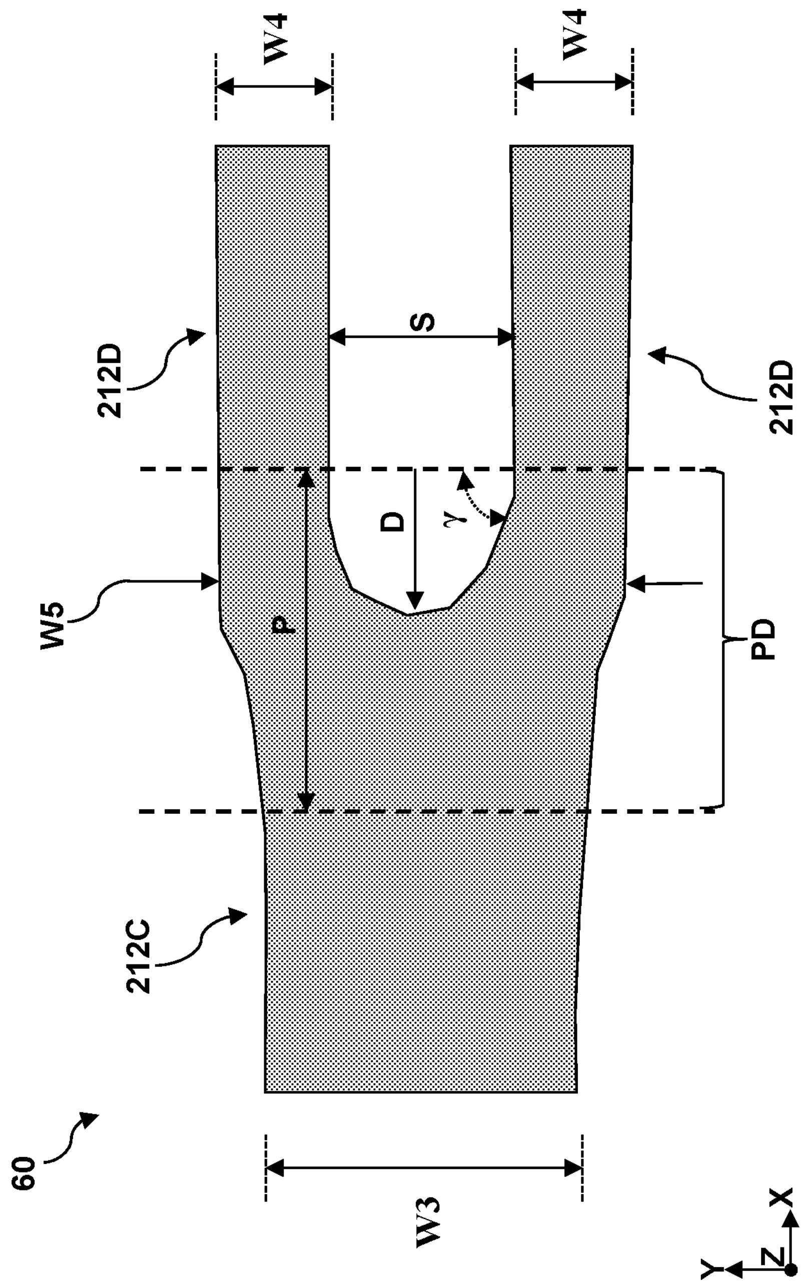

FIG. 6 illustrates an enlarged view of a C-shaped transition portion 60 from a third section 212C to two fourth sections 212D. As shown in FIG. 6, the third section 212C continuously transitions to two fourth section 212D. In some embodiments represented in FIG. 6, the third section 212C may widen from the third width W3 to a fifth width W5 where it continuously transitions into two fourth sections 212D. The fifth width W5 may be equal to a sum of two times of the fourth width W4 and a spacing S between the two fourth sections 212D (i.e., W5=2W4+S). To prevent merging of epitaxial features formed from the two fourth sections 212D, the spacing S may be greater than the fourth width W4, such as between about the fourth width W4 and about two times of the fourth width W4. When a replacement gate process (also known as a gate-last process) is adopted, polysilicon dummy gate stacks may be formed along the dotted lines at two ends of a padding portion (PD). In some embodiments, the shape of the padding portion (PD) is too irregular for the PD to serve as an active region and the PD is to be electrically isolated by dielectric gate structures. In other words, the PD will be an dummy active region that does not serve any electrical function. The transition from the third section 212C to the two fourth sections 212D may be characterized by an angle $\gamma$. To prevent damages to source/drain features, the angle $\gamma$ may be between about 60° and about 75°. This angle range is not trivial. When the angle $\gamma$ is less than 60°, the patterning of a polysilicon dummy gate stack may leave residual polysilicon in the acute angle corner, which prevents satisfactory formation of gate spacers. During a subsequent gate replacement process where the polysilicon dummy gate stack is removed to make room for a metal gate structure, the etchant may etch through the polysilicon in the acute angle corner to damage the source/drain feature. When the angle $\gamma$ is greater than 60°, the probability of undesirable residual polysilicon is substantially reduced. It is noted that the metal gate structures formed along the two dotted lines in FIG. 6 will be removed and replaced with two dielectric gate structures to isolate padding portion (PD) from the rest of the third section 212C and the fourth sections 212D.

Additionally, in some embodiments, the carve-out portion that defines the two fourth sections 212D may extend into the padding portion (PD) from one dummy gate stack position toward another dummy gate stack position by a depth D. As compared to a gate pitch P of the dummy gate stacks, the depth D may be between about 60% and about 120% of the gate pitch P. This ratio of the depth D to the gate pitch P is not trivial. When a replacement gate process is adopted, a polysilicon dummy gate stack may be formed along the dotted lines shown in FIG. 6. When the depth D is less than 60% of the gate pitch P, the patterning of a polysilicon dummy gate stack may leave residual polysilicon in the carve-out portion, which prevents satisfactory formation of gate spacers. During a subsequent gate replacement process where the polysilicon dummy gate stack is removed to make room for a metal gate structure, the etchant may etch through the polysilicon in the carve-out portion to damage the source/drain feature. When the depth D is more than 60% of the gate pitch P, the probability of undesirable residual polysilicon is substantially reduced.

Figure 7:
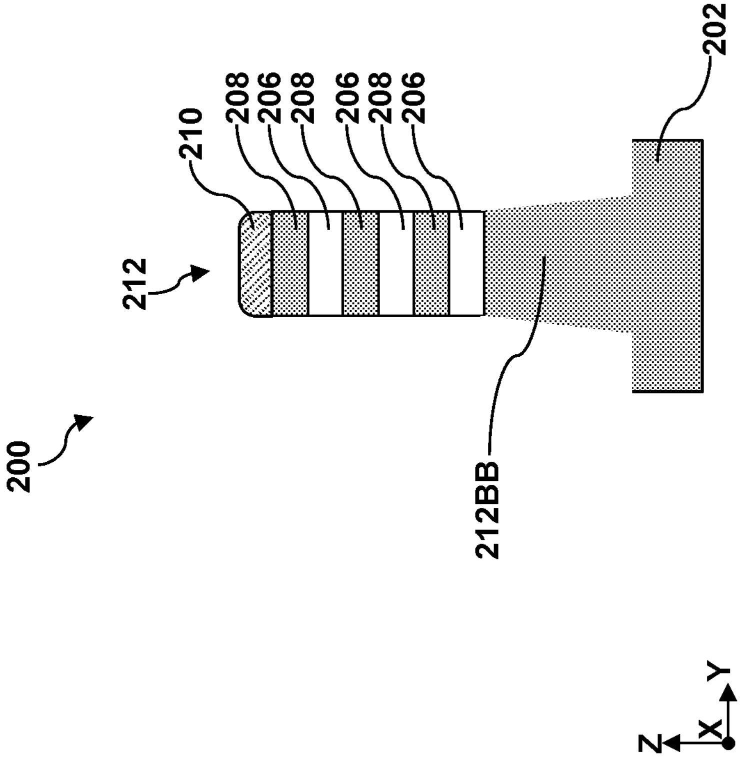

To pattern the stack 204 and a portion of the substrate 202 to form the fin-shaped structures 212, a hard mask layer 210 (shown in FIG. 2) may be deposited over the stack 204 to form an etch mask. The hard mask layer 210 may be a single layer or a multi-layer. For example, the hard mask layer 210 may include a pad oxide layer and a pad nitride layer disposed over the pad oxide layer. The fin-shaped structure 212 may be patterned from the stack 204 and the substrate 202 using a lithography process and an etch process. The lithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etching (e.g., RIE etching), wet etching, and/or other etching methods. As shown in FIG. 7, the etch process at block 104 forms trenches extending vertically through the stack 204 and a portion of the substrate 202. The trenches define the fin-shaped structures 212. As shown in FIG. 7, the fin-shaped structure 212 that includes the sacrificial layers 206 and the channel layers 208 extends vertically along the Z direction and lengthwise along the X direction. The fin-shaped structure 212 includes a base fin structure 212BB patterned from the substrate 202. The patterned stack 204, including the sacrificial layers 206 and the channel layers 208, is disposed directly over the base fin structure 212BB.

Figure 8:
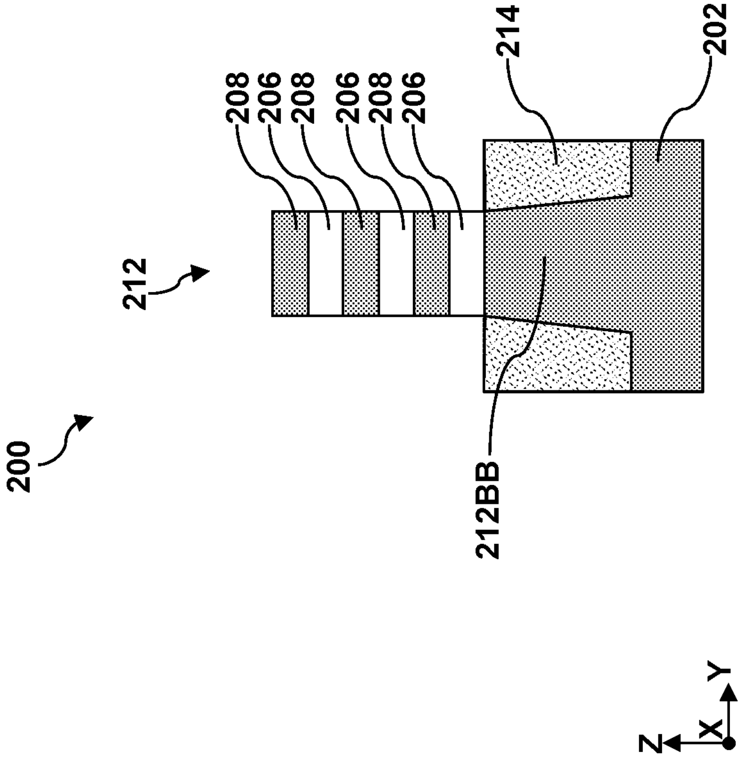

Reference is then made to FIG. 8. An isolation feature 214 is formed adjacent the fin-shaped structure 212. In some embodiments represented in FIG. 8, the isolation feature 214 is disposed on sidewalls of the base fin structure 212BB. In some embodiments, the isolation feature 214 may be formed in the trenches to isolate the fin-shaped structures 212 from a neighboring fin-shaped structure. The isolation feature 214 may also be referred to as a shallow trench isolation (STI) feature 214. By way of example, in some embodiments, a dielectric layer is first deposited over the substrate 202, filling the trenches with the dielectric layer. In some embodiments, the dielectric layer may include silicon oxide, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, a spin-on coating process, and/or other suitable process. The deposited dielectric material is then thinned and planarized, for example by a chemical mechanical polishing (CMP) process. The planarized dielectric layer is further recessed or pulled-back by a dry etching process, a wet etching process, and/or a combination thereof to form the STI feature 214 shown in FIG. 8. The fin-shaped structure 212 rises above the STI feature 214 after the recessing, while the base fin structure 212BB is embedded or buried in the isolation feature 214. The formation of the STI feature 214 may also remove the remaining hard mask layer 210 over the fin-shaped structure 212.

Figure 9:
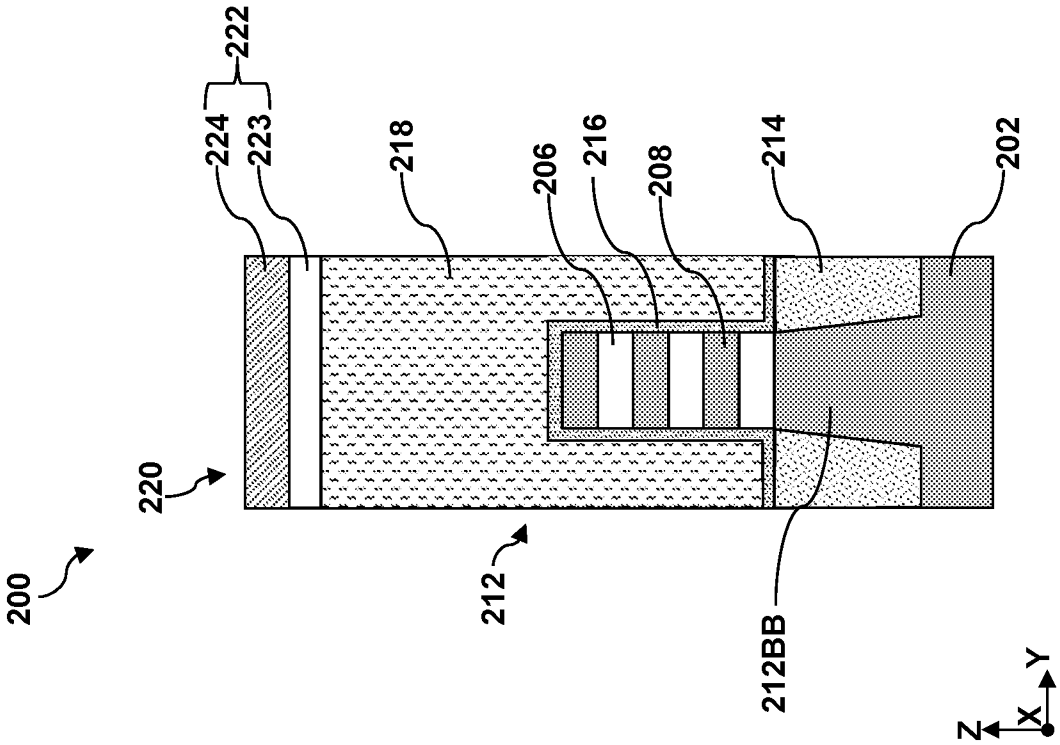
Figure 10:
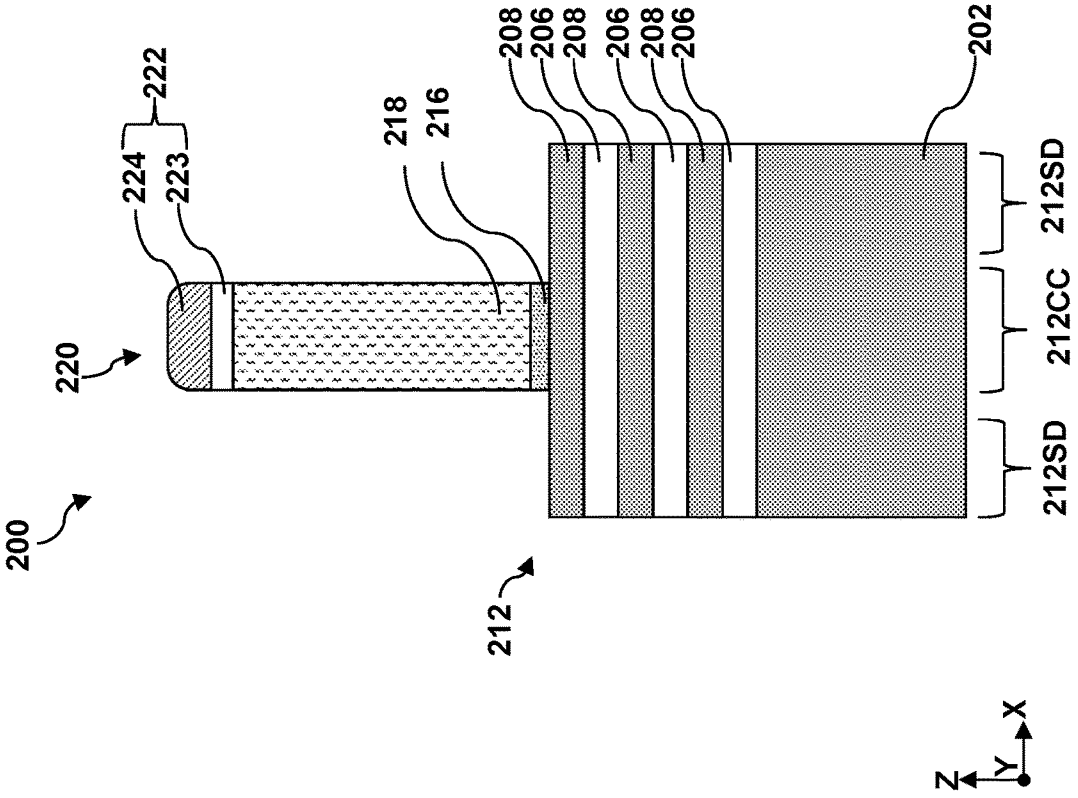

Referring to FIGS. 1 and 9-11, method 100 includes a block 106 where a dummy gate stacks 220 are formed over channel region 212CCs of the fin-shaped structure 212. In some embodiments, a gate replacement process (or gate-last process) is adopted where the dummy gate stack 220 (shown in FIGS. 9 and 10) serves as a placeholder to undergo various processes and is to be removed and replaced by a functional gate structure. Other processes and configuration are possible. In some embodiments illustrated in FIG. 10, the dummy gate stack 220 is formed over the fin-shaped structure 212 and the fin-shaped structure 212 may be divided into channel regions 212CC underlying the dummy gate stacks 220 and source/drain regions 212SD that do not underlie the dummy gate stacks 220. The channel regions 212CC are adjacent the source/drain regions 212SD. As shown in FIG. 10, the channel region 212CC is disposed between two source/drain regions 212SD along the X direction. As shown in FIGS. 9 and 10, the fin-shaped structures 212 extend lengthwise along X direction and the dummy gate stacks 220 extend lengthwise along the Y direction.

The formation of the dummy gate stack 220 may include deposition of layers in the dummy gate stack 220 and patterning of these layers. Referring to FIG. 9, a dummy dielectric layer 216, a dummy electrode layer 218, and a gate-top hard mask layer 222 may be blanketly deposited over the workpiece 200. In some embodiments, the dummy dielectric layer 216 may be formed on the fin-shaped structure 212 using a chemical vapor deposition (CVD) process, an ALD process, an oxygen plasma oxidation process, or other suitable processes. In some instances, the dummy dielectric layer 216 may include silicon oxide. Thereafter, the dummy electrode layer 218 may be deposited over the dummy dielectric layer 216 using a CVD process, an ALD process, or other suitable processes. In some instances, the dummy electrode layer 218 may include polysilicon. For patterning purposes, the gate-top hard mask layer 222 may be deposited on the dummy electrode layer 218 using a CVD process, an ALD process, or other suitable processes. The gate-top hard mask layer 222, the dummy electrode layer 218 and the dummy dielectric layer 216 may then be patterned to form the dummy gate stack 220, as shown in FIG. 10. For example, the patterning process may include a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the gate-top hard mask layer 222 may include a silicon oxide layer 223 and a silicon nitride layer 224 over the silicon oxide layer 223. As shown in FIG. 10, the dummy gate stack 220 is patterned such that it is only disposed over the channel region 212CC, not disposed over the source/drain region 212SD.

Figure 11:
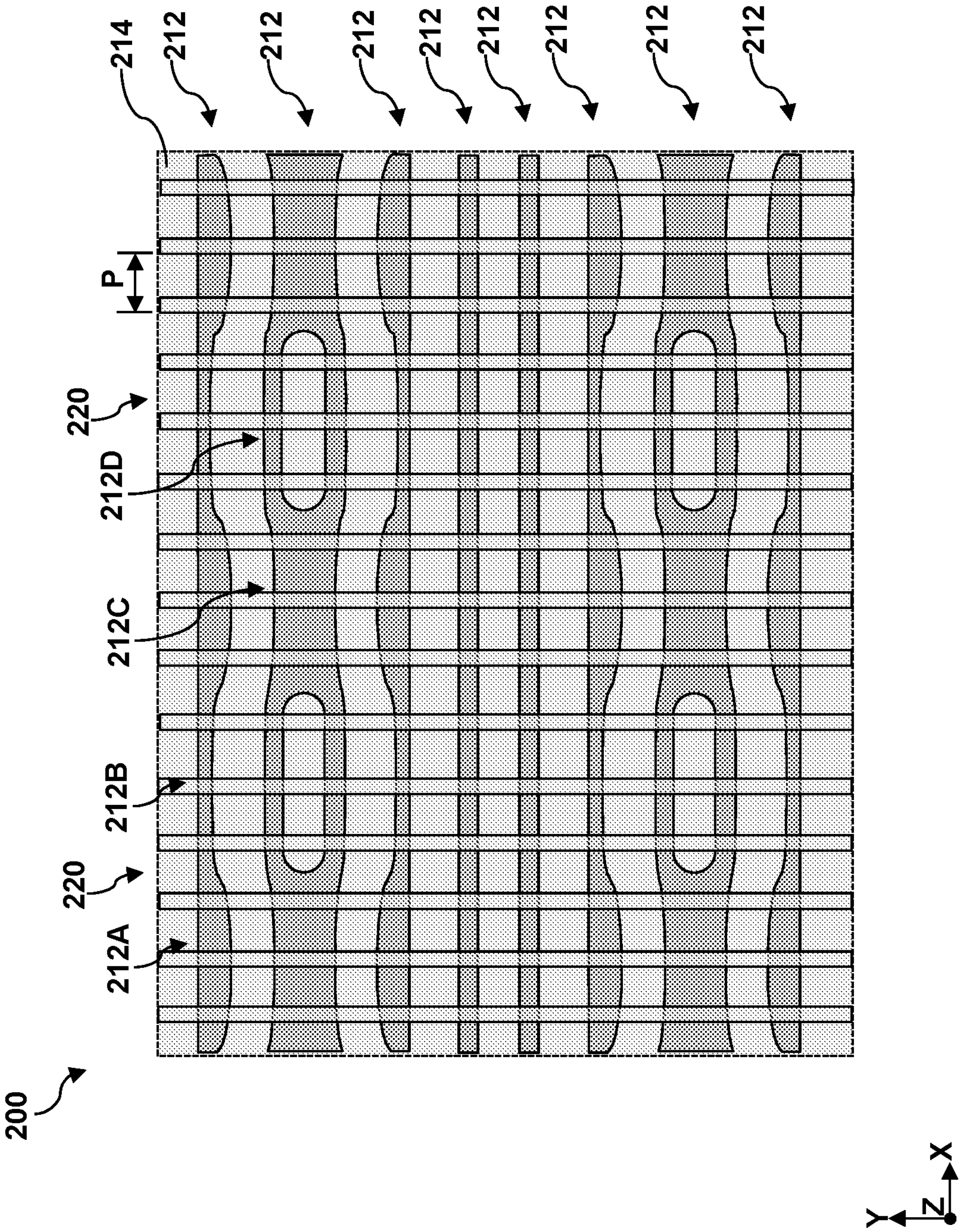
Figure 12:
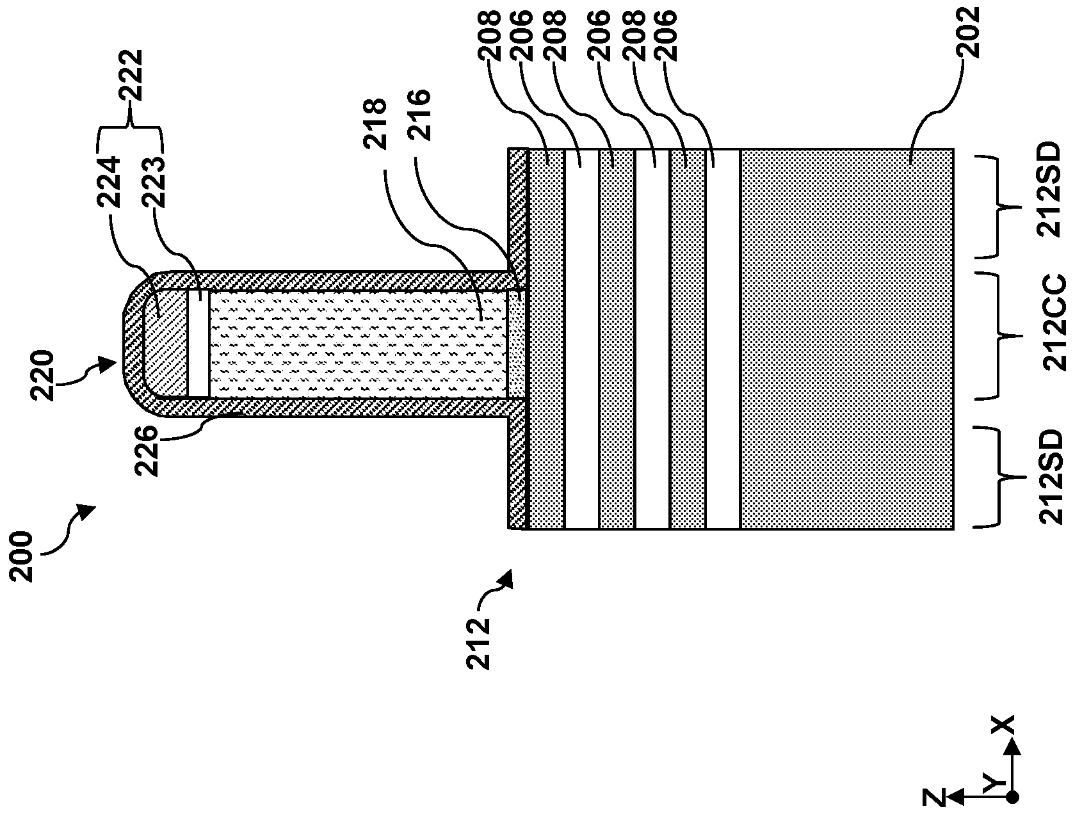

FIG. 11 illustrates dummy gate stacks 220 formed over sections of the fin-shaped structures 212. In some embodiments represented in FIG. 11, while the different sections of the fin-shaped structures 212 have different width along the Y direction, the dummy gate stacks 220 are even pitched at the gate pitch P and have a uniform width.

Referring to FIGS. 1 and 12-17, method 100 includes a block 108 where at least one gate spacer layer 226 is deposited over the workpiece 200, including over the dummy gate stack 220. In some embodiments represented in FIG. 12, the gate spacer layer 226 is deposited conformally over the workpiece 200, including over top surfaces and sidewalls of the dummy gate stack 220. The term "conformally" may be used herein for ease of description of a layer having substantially uniform thickness over various regions. The at least one gate spacer layer 226 may be a single layer or a multi-layer. The at least one gate spacer layer 226 may include silicon carbonitride, silicon oxycarbide, silicon oxycarbonitride, or silicon nitride. The at least one gate spacer layer 226 may be deposited over the dummy gate stack 220 using processes such as, a CVD process, a subatmospheric CVD (SACVD) process, an ALD process, or other suitable process.

Figure 13:
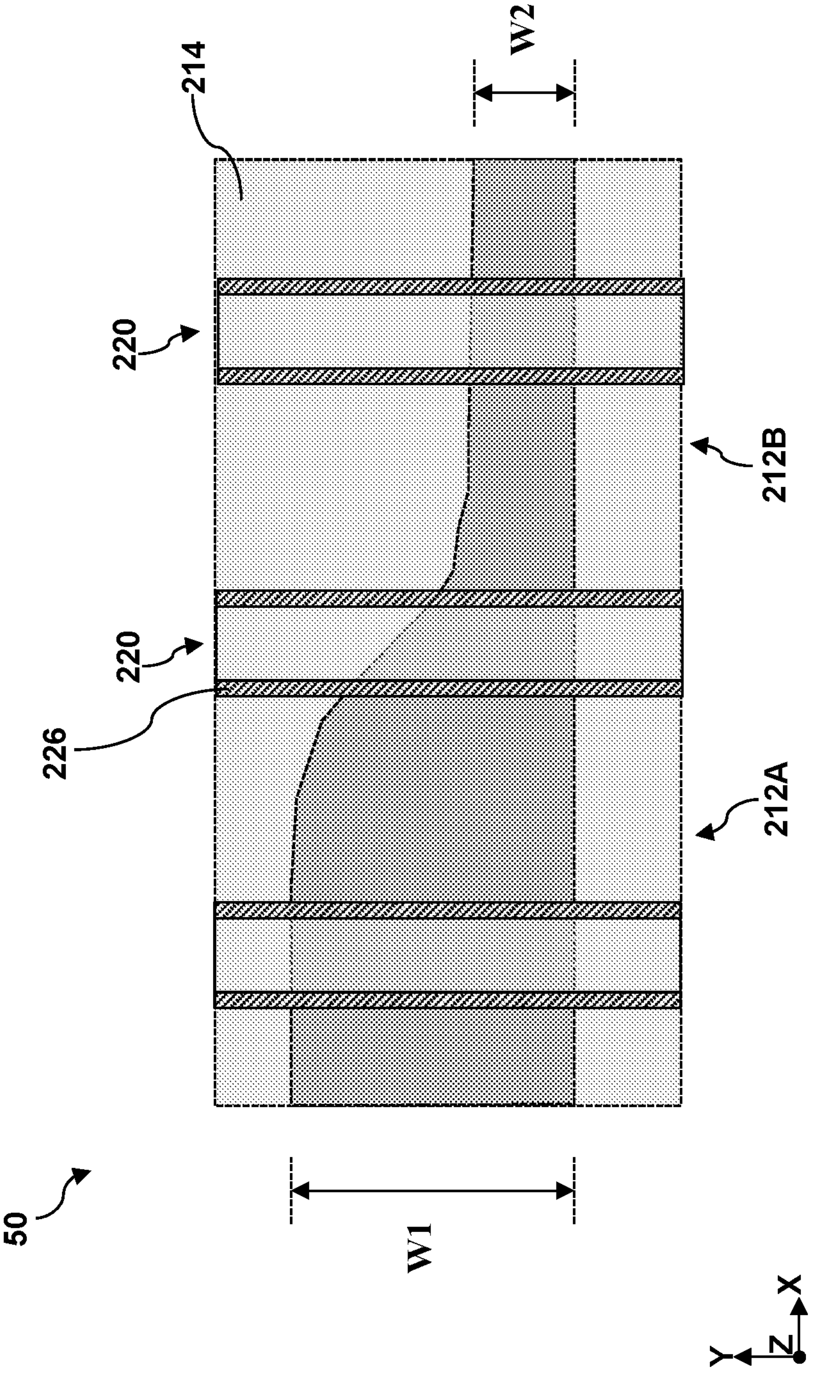

FIG. 13 illustrates dummy gate stacks 220 and at least one gate spacer layer 226 disposed over the L-shaped transition portion 50. The at least one gate spacer layer 226 is not only disposed along sidewalls of the dummy gate stacks 220 but also over top surfaces of the dummy gate stacks 220, the first section 212A, the second section 212B, and the isolation feature 214. For ease of illustration, the at least one gate spacer layer 226 over the top surfaces are not shown in FIG. 13. In some embodiments illustrated in FIG. 13, a dummy gate stack 220 extends lengthwise along the Y direction to span over the sloped portion of the L-shaped transition portion 50. While not explicitly shown in FIG. 13, when the first width W1 is more than twice of the second width W2, two dummy gate stacks 220 may be arranged at ends of the sloped portion of the L-shaped transition portion 50. These two dummy gate stacks 220 will subsequently be replaced by dielectric gate structures to ensure that the more abrupt transition does not affect the circuit function.

Figure 14:
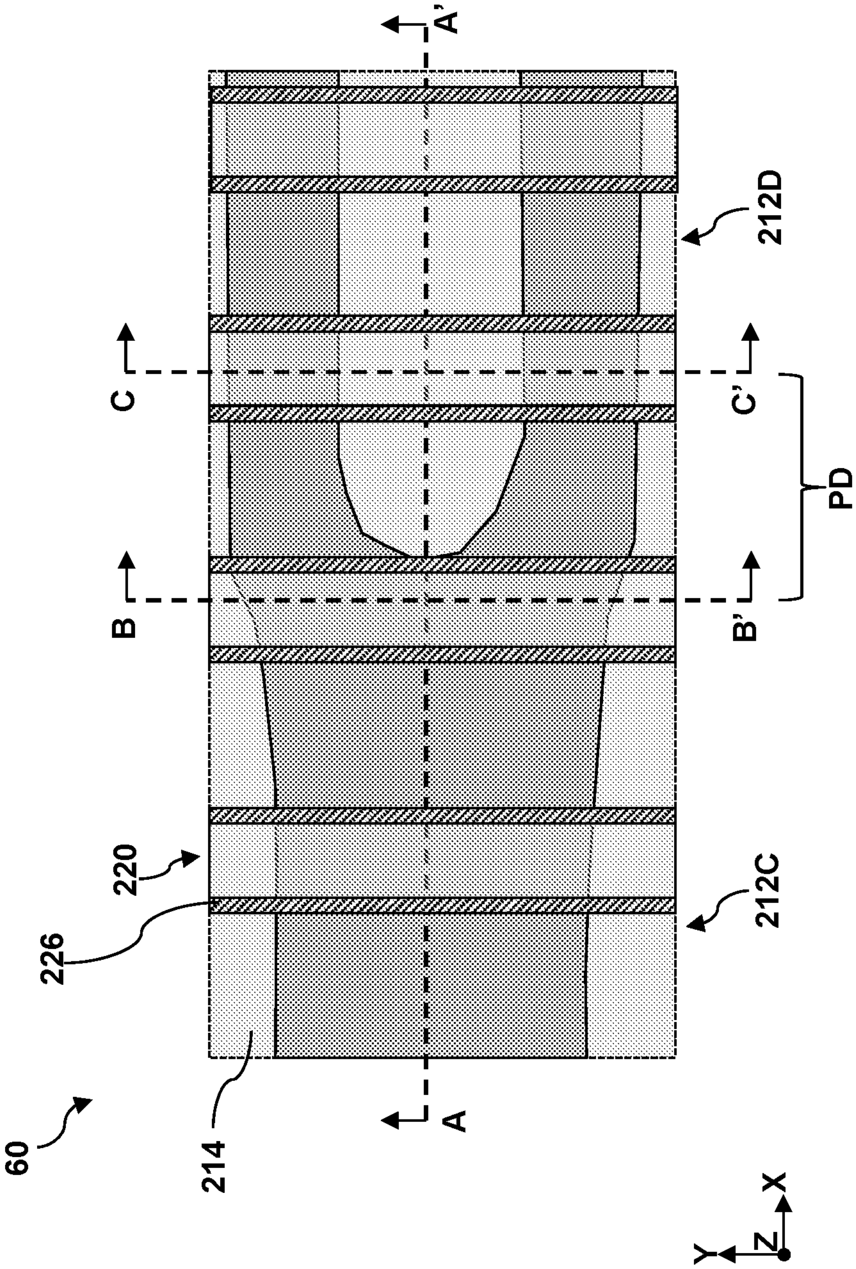

FIG. 14 illustrates dummy gate stacks 220 and at least one gate spacer layer 226 disposed over the C-shaped transition portion 60. The at least one gate spacer layer 226 is not only disposed along sidewalls of the dummy gate stacks 220 but also over top surfaces of the dummy gate stacks 220, the third section 212C, the fourth sections 212D, and the isolation feature 214. For ease of illustration, the at least one gate spacer layer 226 over the top surfaces are not shown in FIG. 14. FIG. 14 illustrates three lines—a line A-A' cutting through third section 212C along the X direction and between the two fourth sections 212D, a line B-B' cutting through a dummy gate stack 220 disposed over the third section 212C adjacent an intersection between the third section 212C and the fourth section 212D, and a line C-C' cutting through another dummy gate stack 220 extending over the two fourth sections 212D.

Figure 15:
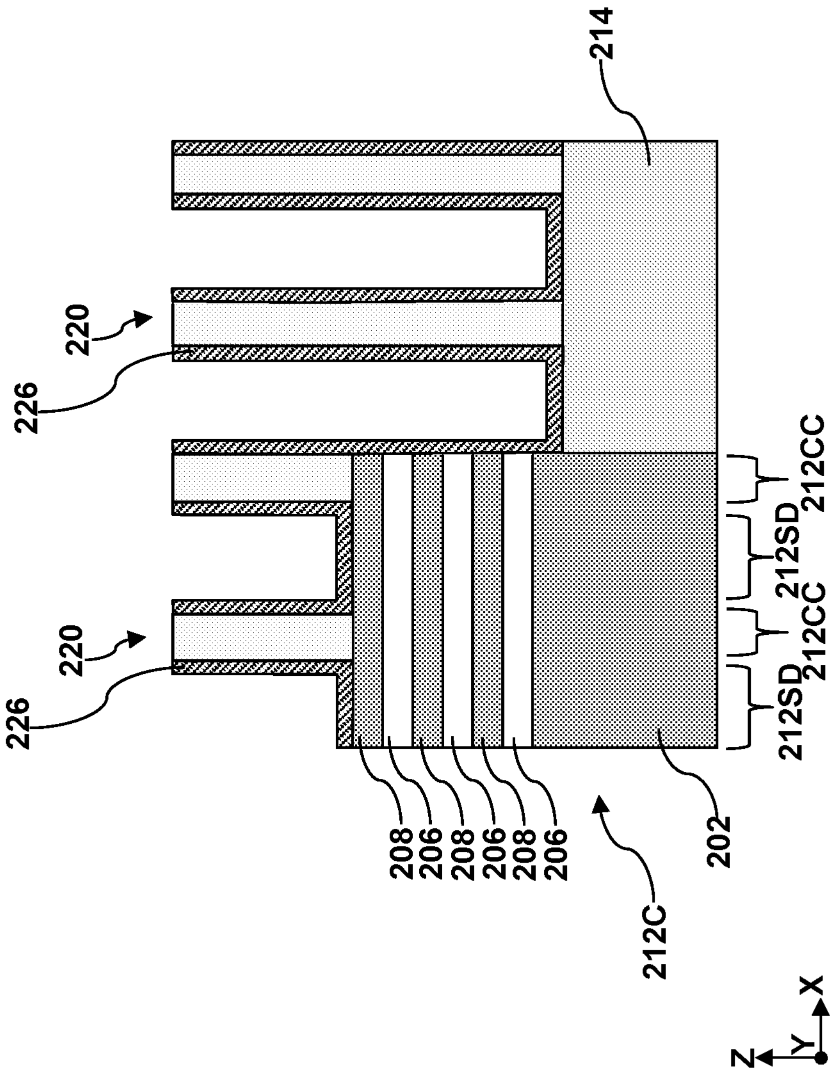

FIG. 15 illustrates a fragmentary cross-sectional view along section A-A' in FIG. 14. Section A-A' cuts through the third section 212C and extends between the two fourth sections 212D. The at least one gate spacer layer 226 is disposed along sidewalls of the dummy gate stacks 220 and over top surfaces of the third section 212C and the isolation feature 214. In fact, while not shown in FIG. 15, the at least one gate spacer layer 226 is also disposed over top surfaces of the dummy gate stacks 220. FIG. 15 is a fragmentary cross-sectional view that does not show the entirety of the dummy gate stacks 220. For that reason, the portion of the at least one gate spacer layer 226 on top of the dummy gate stacks 220 is not shown in FIG. 15. It is noted that the at least one gate spacer layer 226 comes in direct contact with an end surface of the third section 212C, which exposes all the channel layers 208 and sacrificial layers 206 therein.

Figure 16:
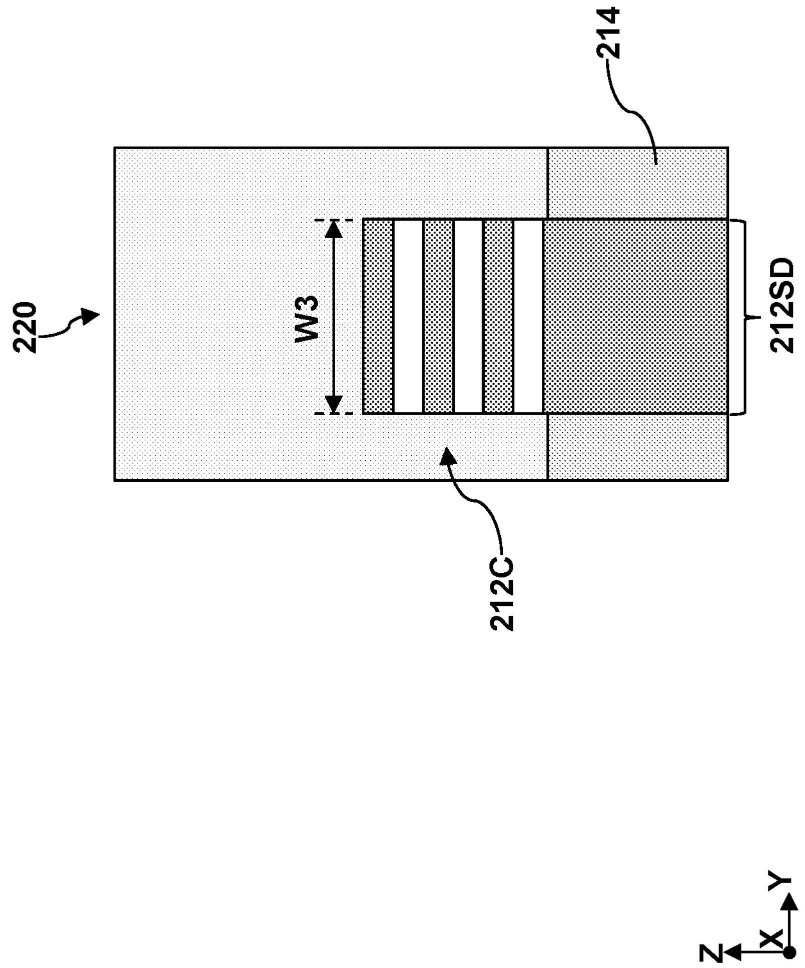

FIG. 16 illustrates a fragmentary cross-sectional view along section B-B' in FIG. 14. As shown in FIG. 16, the third section 212C extends lengthwise along the X direction and the dummy gate stack 220 extends lengthwise along the Y direction to span over a channel region of the third section 212C. As described above, the third section 212C has the third width W3 along the Y direction.

Figure 17:
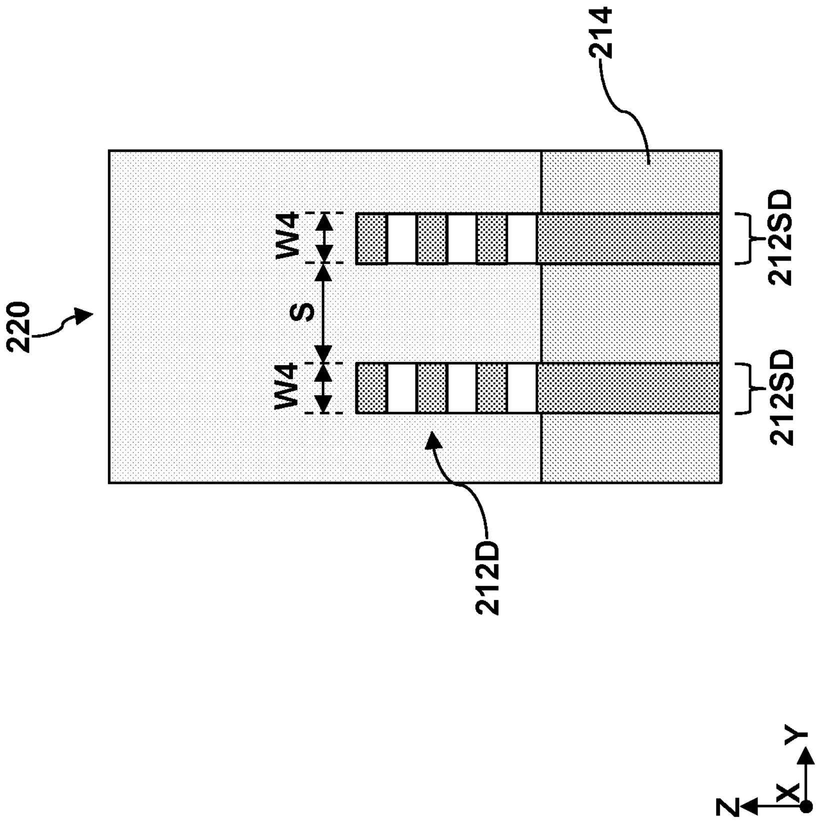

FIG. 17 illustrates a fragmentary cross-sectional view along section C-C' in FIG. 14. As shown in FIG. 17, each of the fourth section 212D extends lengthwise along the X direction and the dummy gate stack 220 extends lengthwise along the Y direction to span over channel regions of the two fourth sections 212D. As described above, each of the fourth section 212D has the fourth width W4 along the Y direction. The third width W3 is greater than the fourth width W4. The two fourth sections 212D are spaced apart from one another along the Y direction by the spacing S.

Figure 18:
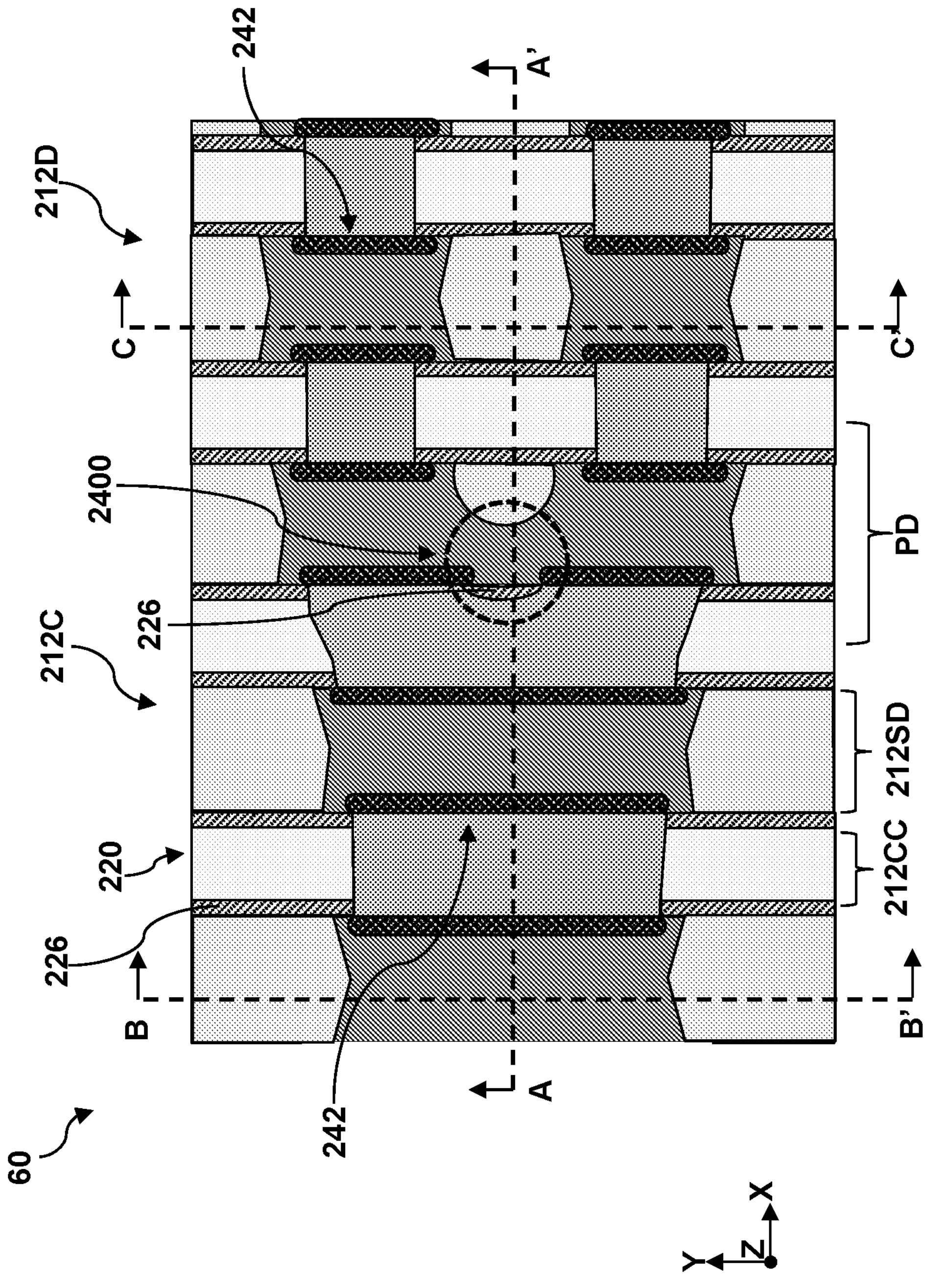

Referring to FIGS. 1 and 18, method 100 includes a block 110 where a source/drain region 212SD of the fin-shaped structure 212 is anisotropically recessed to form a source/drain trench (shown as being filled with source/drain features 242 in FIG. 18). The anisotropic etch may include a dry etch or a suitable etch process that etches the source/drain regions 212SD and a portion of the substrate 202 below the source/drain regions 212SD. The resulting source/drain trench extends vertically through the depth of the stack 204 and partially into the substrate 202. An example dry etch process for block 110 may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. The source/drain regions 212SD of the fin-shaped structure 212 are recessed to expose sidewalls of the sacrificial layers 206 and the channel layers 208 in the fin-shaped structure 212. Because the source/drain trenches extend below the stack 204 into the substrate 202, the source/drain trenches include bottom surfaces and lower sidewalls defined in the substrate 202.

Figure 19:
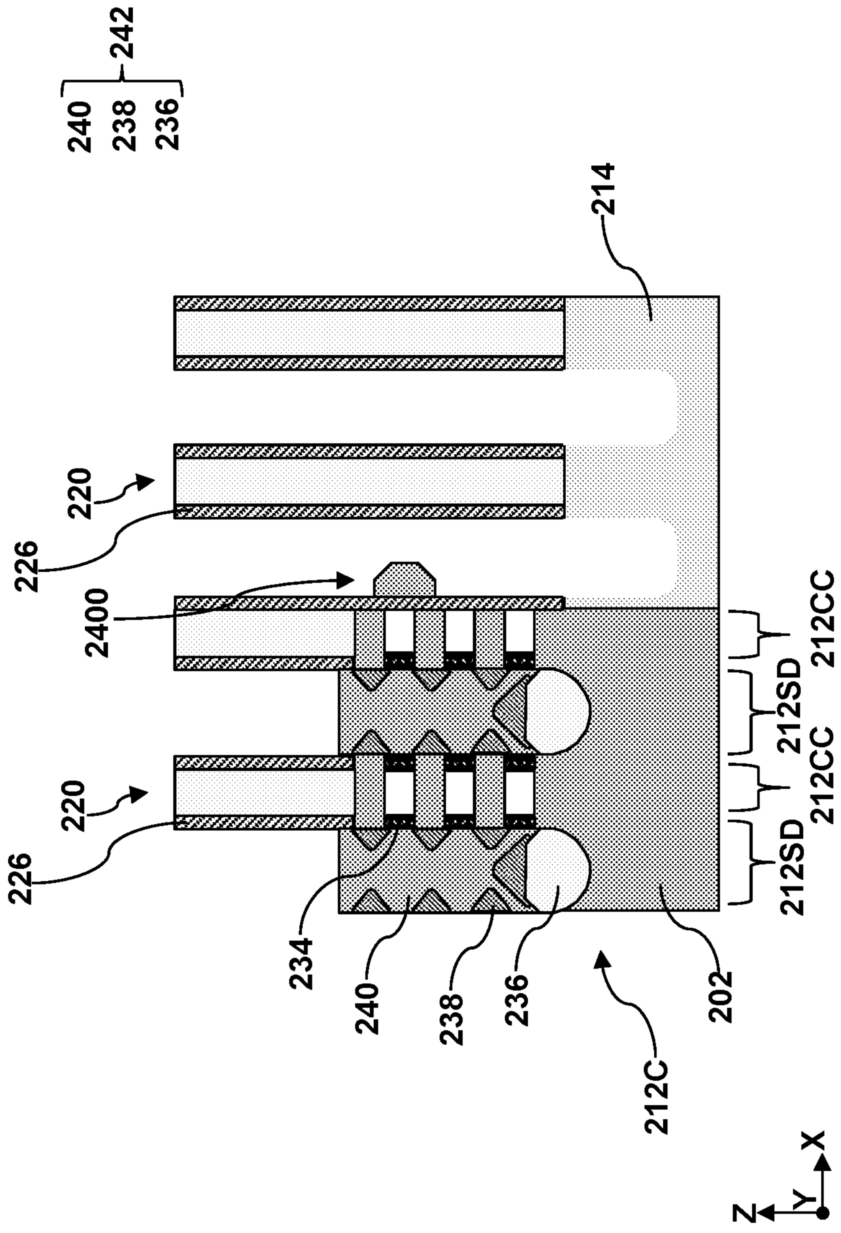

Referring to FIGS. 1 and 19, method 100 includes a block 112 where inner spacer features 234 are formed. While not shown explicitly, operation at block 112 may include selective and partial removal of the sacrificial layers 206 to form inner spacer recesses (shown in FIG. 19 as being filled with inner spacer features 234), deposition of inner spacer material over the workpiece 200, and etch back the inner spacer material to form inner spacer features 234 in the inner spacer recesses. Referring to FIG. 19, the sacrificial layers 206 exposed in the source/drain trenches are selectively and partially recessed to form inner spacer recesses (shown in FIG. 19 as being filled with inner spacer features 234) while the at least one gate spacer layer 226, the exposed portion of the substrate 202, and the channel layers 208 are substantially unetched. In an embodiment where the channel layers 208 consist essentially of silicon (Si) and sacrificial layers 206 consist essentially of silicon germanium (SiGe), the selective recess of the sacrificial layers 206 may be performed using a selective wet etch process or a selective dry etch process. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

After the inner spacer recesses are formed, an inner spacer material is deposited over the workpiece 200, including over the inner spacer recesses. The inner spacer material may include metal oxides, silicon oxide, silicon oxycarbonitride, silicon nitride, silicon oxynitride, carbon-rich silicon carbonitride, or a low-k dielectric material. The metal oxides may include aluminum oxide, zirconium oxide, tantalum oxide, yttrium oxide, titanium oxide, lanthanum oxide, or other suitable metal oxide. While not explicitly shown, the inner spacer material may be a single layer or a multilayer. In some implementations, the inner spacer material may be deposited using CVD, PECVD, SACVD, ALD or other suitable methods. The inner spacer material is deposited into the inner spacer recesses as well as over the sidewalls of the channel layers 208 exposed in the source/drain trenches. Referring to FIG. 19, the deposited inner spacer material is then etched back to remove the inner spacer material from the sidewalls of the channel layers 208 to form the inner spacer features 234. At block 112, the inner spacer material may also be removed from the top surfaces and/or sidewalls of the gate-top hard mask layer 222 and the at least one gate spacer layer 226. In some implementations, the etch back operations performed at block 112 may include use of hydrogen fluoride (HF), fluorine gas ($F_2$), hydrogen ($H_2$), ammonia ($NH_3$), nitrogen trifluoride ($NF_3$), or other fluorine-based etchants. As shown in FIG. 19, each of the inner spacer features 234 is in direct contact with the recessed sacrificial layers 206 and is disposed vertically (along the Z direction) between two neighboring channel layers 208.

While not explicitly shown, before any of the epitaxial layers are formed, method 100 may include a cleaning process to clean surfaces of the workpiece 200. The cleaning process may include a dry clean, a wet clean, or a combination thereof. In some examples, the wet clean may include use of standard clean 1 (RCA SC-1, a mixture of deionized (DI) water, ammonium hydroxide, and hydrogen peroxide), standard clean 2 (RCA SC-2, a mixture of DI water, hydrochloric acid, and hydrogen peroxide), SPM (a sulfuric peroxide mixture), and/or hydrofluoric acid for oxide removal. The dry clean process may include helium (He) and hydrogen ($H_2$) treatment. The hydrogen treatment may convert silicon on the surface to silane ($SiH_4$), which may be pumped out for removal.

Referring to FIGS. 1 and 18-21, method 100 includes a block 114 where source/drain features 242 are formed. In the embodiments represented in FIGS. 18-21, the source/drain features 242 are formed over the recessed source/drain regions 212SD of the fin-shaped structures 212, including the third section 212C and the fourth sections 212D. In some embodiments represented in FIG. 18-21, each of the source/drain features 242 includes a buffer semiconductor layer 236, a first epitaxial layer 238, and a second epitaxial layer 240. At block 114, the buffer semiconductor layer 236 is selectively deposited over surfaces of the substrate 202 exposed in the source/drain trenches (shown as being filled with the source/drain features 242 in FIGS. 18 and 19). The buffer semiconductor layer 236 functions to prevent leakage through the substrate 202. To reduce the conductivity of the buffer semiconductor layer 236, the buffer semiconductor layer 236 is undoped or not intentionally doped. In some embodiments, the buffer semiconductor layer 236 may include undoped silicon (Si), undoped germanium (Ge), undoped silicon germanium (SiGe), or undoped germanium tin (GeSn). At block 114, in order to selectively deposit the buffer semiconductor layer 236 on the substrate 202, the buffer semiconductor layer 236 may be epitaxially deposited over the source/drain trenches using silicon precursors such as silane ($SiH_4$), dichlorosilane ($SiH_2Cl_2$), germanium precursors such as germane (GeH4), and carrier gas such as nitrogen ($N_2$) or hydrogen ($H_2$). Hydrogen chloride (HCl) may be introduced to improve deposition selectivity such that little or no of the buffer semiconductor layer 236 is deposited on sidewalls of the inner spacer features, sidewalls of the channel layers 208, or sidewalls of the at least one gate spacer layer 226. Upon its formation, the buffer semiconductor layers 236 are in direct contact with surfaces of the substrate 202 that are exposed in the source/drain trenches.

The first epitaxial layer 238 is then selectively deposited over a top surface of the buffer semiconductor layers 236 and exposed sidewalls of the channel layer 208, as shown in FIG. 19. In some embodiments, the deposition of the buffer semiconductor layer 236 and deposition of the first epitaxial layer 238 are performed in separate process chambers to ensure that the buffer semiconductor layer 236 is not contaminated by any dopant. That is, after the buffer semiconductor layer 236 is formed in a first process chamber, the workpiece 200 is removed from the first process chamber and transported to a different second process chamber for operations at block 116. To ensure selective deposition of the first epitaxial layer 238, the first epitaxial layer 238 may be deposited using a growth-etch deposition process or a cyclic deposition process. As its name suggests, the growth-etch deposition process includes a growth component (or growth cycles) and an etch component (or etch cycles). The growth component (or growth cycles) selectively deposits the first epitaxial layer 238 primarily on semiconductor surfaces and the etch component (or etch cycles) removes the first epitaxial layer 238 deposited on non-semiconductor surfaces. Depending on the conductivity type of the resulting device, the first epitaxial layer 238 may include silicon (Si) or silicon germanium (SiGe). When the first epitaxial layer 238 is formed of silicon (Si), it may be in-situ doped with an n-type dopant, such as phosphorus (P) or arsenic (As). When the first epitaxial layer 238 is formed of silicon germanium (SiGe), it may be in-situ doped with a p-type dopant, such as boron (B) or boron difluoride ($BF_2$).

Referring to FIGS. 18-21, the second epitaxial layer 240 is deposited over surfaces of the first epitaxial layer 238 and the inner spacer features 234. In some embodiments, the deposition of the first epitaxial layer 238 and the deposition of the second epitaxial layer 240 are performed in situ in the same process chambers as there are less dopant contamination concerns. In some embodiments, the second epitaxial layer 240 may be deposited using vapor-phase epitaxy (VPE), ultra-high vacuum CVD (UHV-CVD), molecular beam epitaxy (MBE), and/or other suitable processes. The second epitaxial layer 240 is a heavily doped semiconductor layer to reduce parasitic resistance. For that reason, the volume of the second epitaxial layer 240 is maximized. Depending on the conductivity type of the resulting device, the second epitaxial layer 240 may include silicon (Si) or silicon germanium (SiGe). When the second epitaxial layer 240 is formed of silicon (Si), it may be in-situ doped with an n-type dopant, such as phosphorus (P) or arsenic (As). When the second epitaxial layer 240 is formed of silicon germanium (SiGe), it may be in-situ doped with a p-type dopant, such as boron (B) or boron difluoride ($BF_2$). While the first epitaxial layer 238 and the second epitaxial layer 240 may share the same semiconductor material and even the same dopant type, the dopant concentration in the second epitaxial layer 240 is greater than that in the first epitaxial layer 238.

In one embodiment, the buffer semiconductor layer 236 includes undoped silicon, the first epitaxial layer 238 includes silicon doped with phosphorus (Si:P), and the second epitaxial layer 240 includes silicon doped with phosphorus (Si:P). The buffer semiconductor layer 236 is spaced apart from the second epitaxial layer 240 by the first epitaxial layer 238. The first epitaxial layer 238 serves as a shielding epitaxial layer to prevent dopant diffusion from the second epitaxial layer 240 into the buffer semiconductor layer 236. The undoped buffer semiconductor layer 236 functions as a leakage reduction feature to reduce leakage current through the substrate 202. When too much dopant in the second epitaxial layer 240 is allowed to diffuse into the buffer semiconductor layer 236, the buffer semiconductor layer 236 may not function properly to reduce leakage.

Figure 20:
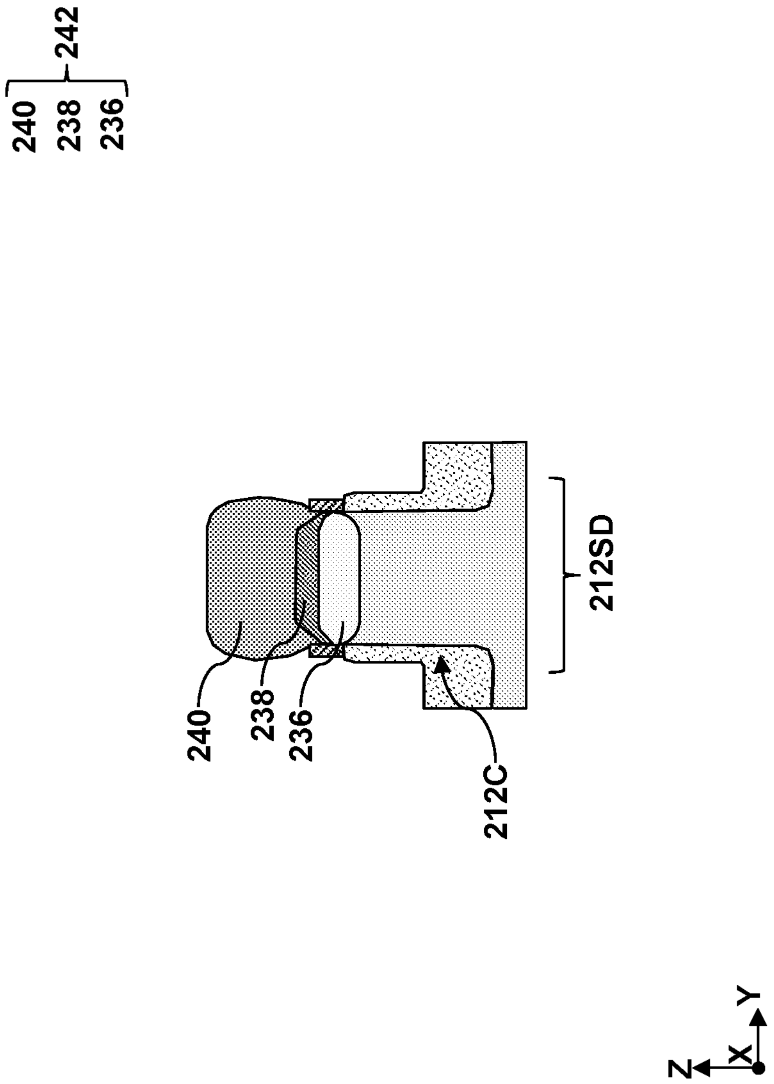
Figure 21:
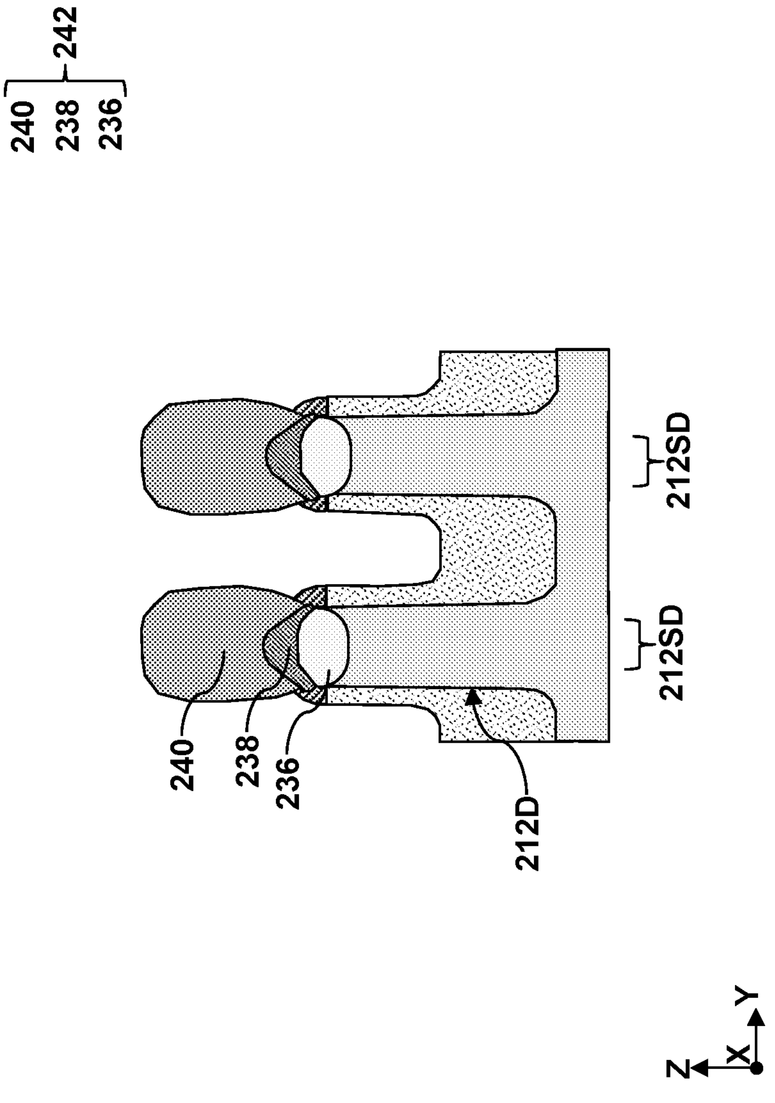

Referring to FIGS. 19-21, the buffer semiconductor layer 236, the first epitaxial layer 238, and the second epitaxial layer 240 over one source/drain region 212SD may be collectively referred to as a source/drain feature 242. The source/drain feature 242 interfaces sidewalls of the channel layers 208 and the substrate 202. The second epitaxial layer 240 account for a majority of a total volume of the source/drain feature 242. The second epitaxial layer 240 may come in direct contact with sidewalls of the inner spacer features 234. While not explicitly shown, the source/drain feature may additionally include a third epitaxial layer over the second epitaxial layer 240 to prevent dopant diffusion from the heavily doped second epitaxial layer 240.

Reference is now made to FIGS. 18 and 19. In some embodiments, because of reduced spacing between the two fourth sections 212D where they first branch out from the third section 212C, the source/drain features 242 may merge over the at least one gate spacer 226 to form a merged portion 2400. Along section A-A's shown in FIG. 19, the merged portion 2400 may have an island shape that does not share the height of the source/drain features 242. The merging of the source/drain features 242 in the padding portion (PD) explains part of the reason why the padding portion (PD) is made into a dummy section that is electrically insulated from the rest of the third section 212C and the fourth section 212D by dielectric gates.

Figure 22:
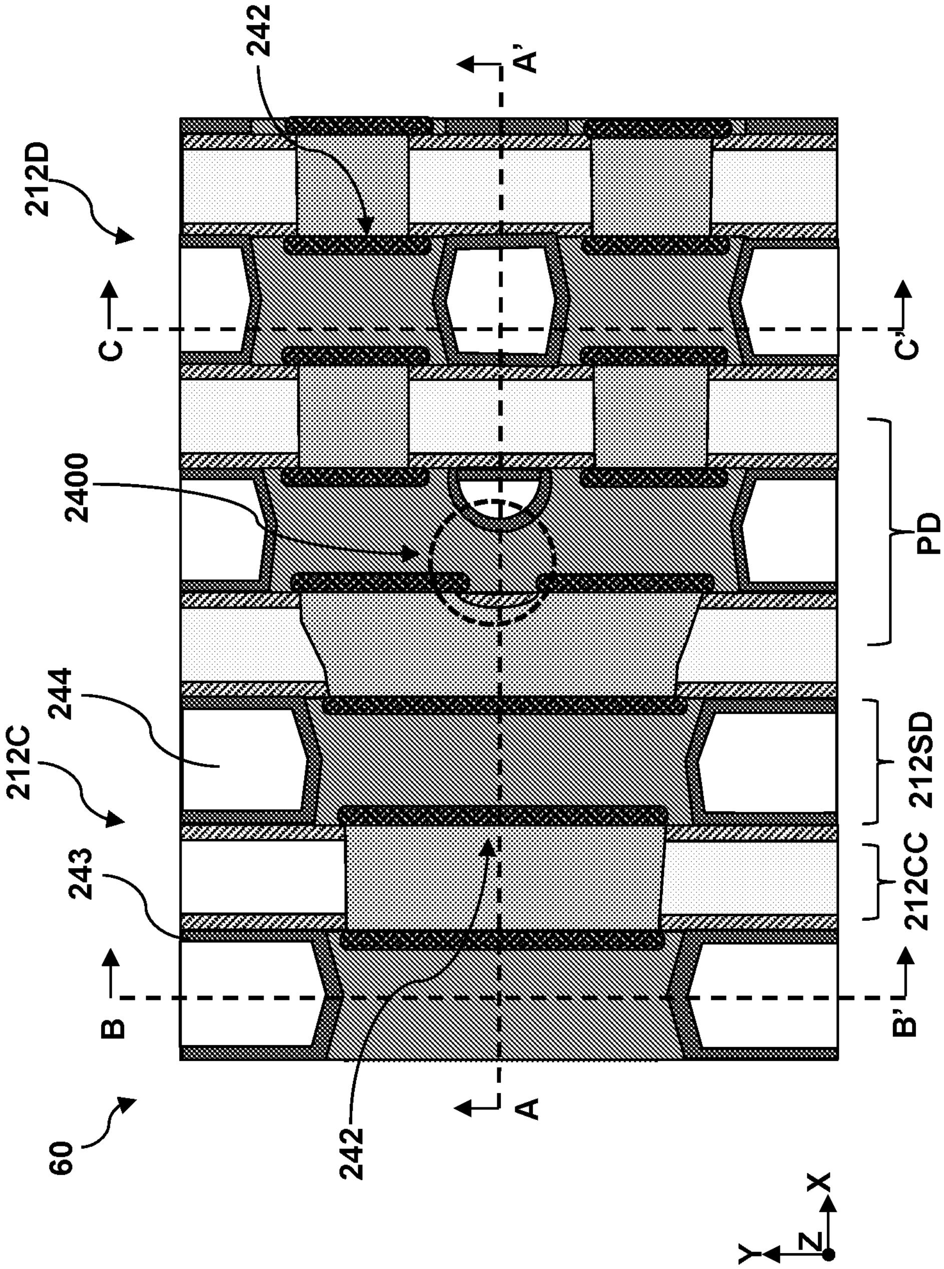

Referring to FIGS. 1 and 22-27, method 100 includes a block 116 where the dummy gate stack 220 is replaced with a gate structure 250. Block 116 may include deposition of a contact etch stop layer (CESL) 243 over the isolation feature 214 and the source/drain features 242, deposition of an interlayer dielectric (ILD) layer 244 over the CESL 243, removal of the dummy gate stack 220, selective removal of the sacrificial layers 206 in the channel region 212CC to release the channel layers 208 as channel members 2080, and formation of the gate structure 250 to wrap around each of the channel members 2080. Referring to FIG. 22, the CESL 243 and the ILD layer 244 are deposited over the workpiece 200, including over the source/drain features 242 in the third section 212C and the fourth sections 212D. In some embodiments, the CESL 243 may include silicon nitride and the ILD layer 244 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The CESL 243 may be deposited using CVD or ALD. The ILD layer 244 may be deposited using CVD, FCVD, spin-on coating, or a suitable deposition technique. After the deposition of the ILD layer 244, the workpiece 200 may be planarized by a planarization process to expose the dummy gate stack 220. For example, the planarization process may include a chemical mechanical planarization (CMP) process. Exposure of the dummy gate stack 220 allows the removal of the dummy gate stack 220.

Figure 23:
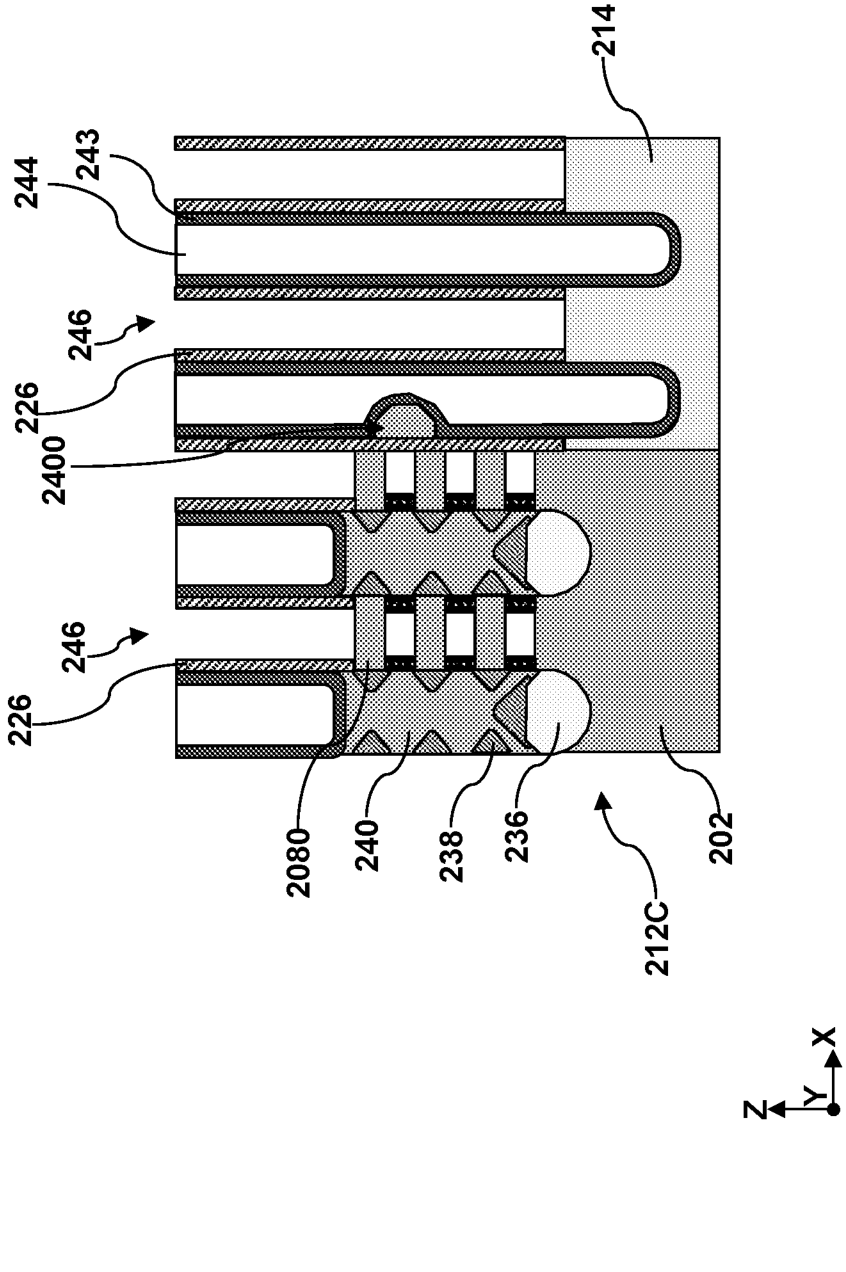

Referring to FIG. 23, which illustrates a fragmentary cross-sectional view along section A-A' in FIG. 22, the dummy gate stack 220 is removed. The removal of the dummy gate stack 220 may include one or more etching processes that are selective to the material of the dummy gate stack 220. For example, the removal of the dummy gate stack 220 may be performed using as a selective wet etch, a selective dry etch, or a combination thereof that is selective to the dummy gate stack 220. After the removal of the dummy gate stack 220, sidewalls of the channel layers 208 and the sacrificial layers 206 in the channel region 212CC are exposed. Referring still to FIG. 23, after the removal of the dummy gate stack 220, the sacrificial layers 206 between the channel layers 208 in the channel region 212CC are selectively removed. The selective removal of the sacrificial layers 206 releases the channel layers 208 to form channel members 2080 shown in FIG. 23. The selective removal of the sacrificial layers 206 forms a gate trench 246 that includes spaces between adjacent channel members 2080. The selective removal of the sacrificial layers 206 may be implemented by selective dry etch, selective wet etch, or other selective etch processes. An example selective dry etching process may include use of one or more fluorine-based etchants, such as fluorine gas or hydrofluorocarbons. An example selective wet etching process may include an APM etch (e.g., ammonia hydroxide-hydrogen peroxide-water mixture).

Figure 25:
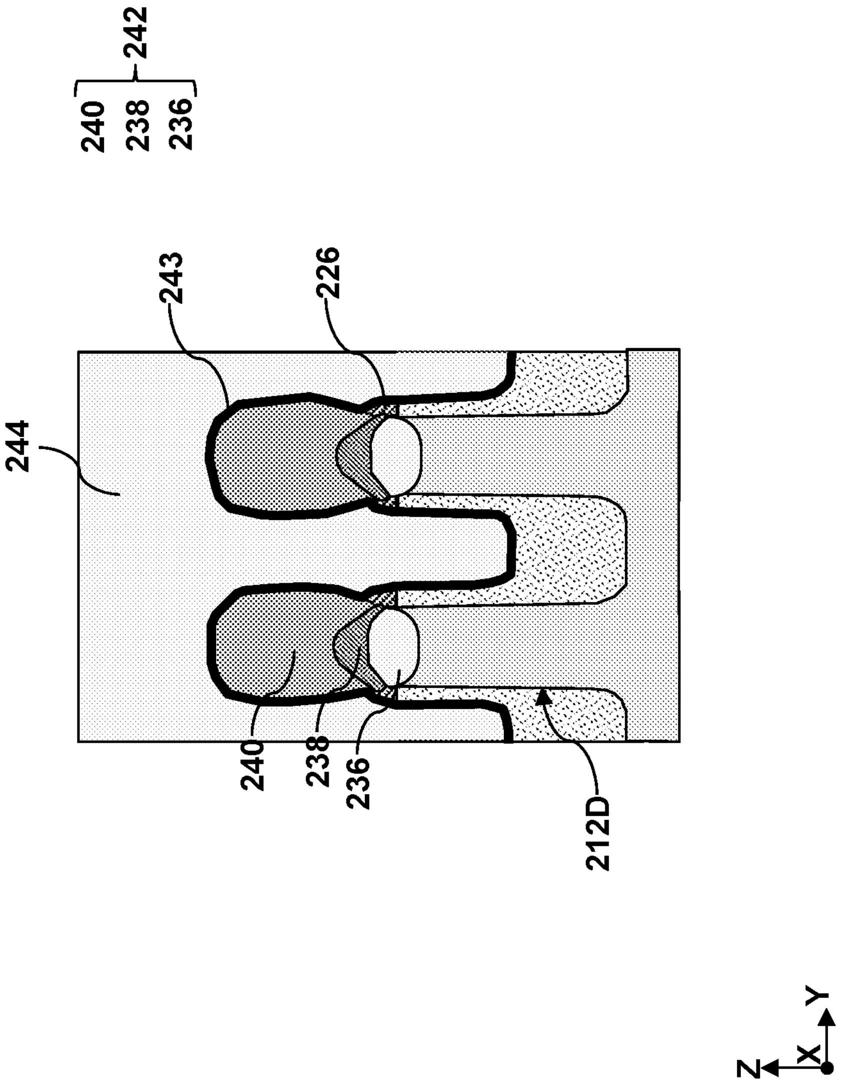

Referring to FIGS. 24 and 25, which illustrate fragmentary cross-sectional views along sections B-B' and C-C' in FIG. 22, respectively. As shown in FIG. 24, the CESL 243 and the ILD layer 244 are sequentially deposited over the source/drain features 242 over the third section 212C. As shown in FIG. 25, the CESL 243 and the ILD layer 244 are sequentially deposited over the source/drain features 242 over the two fourth sections 212D.

Figure 26:
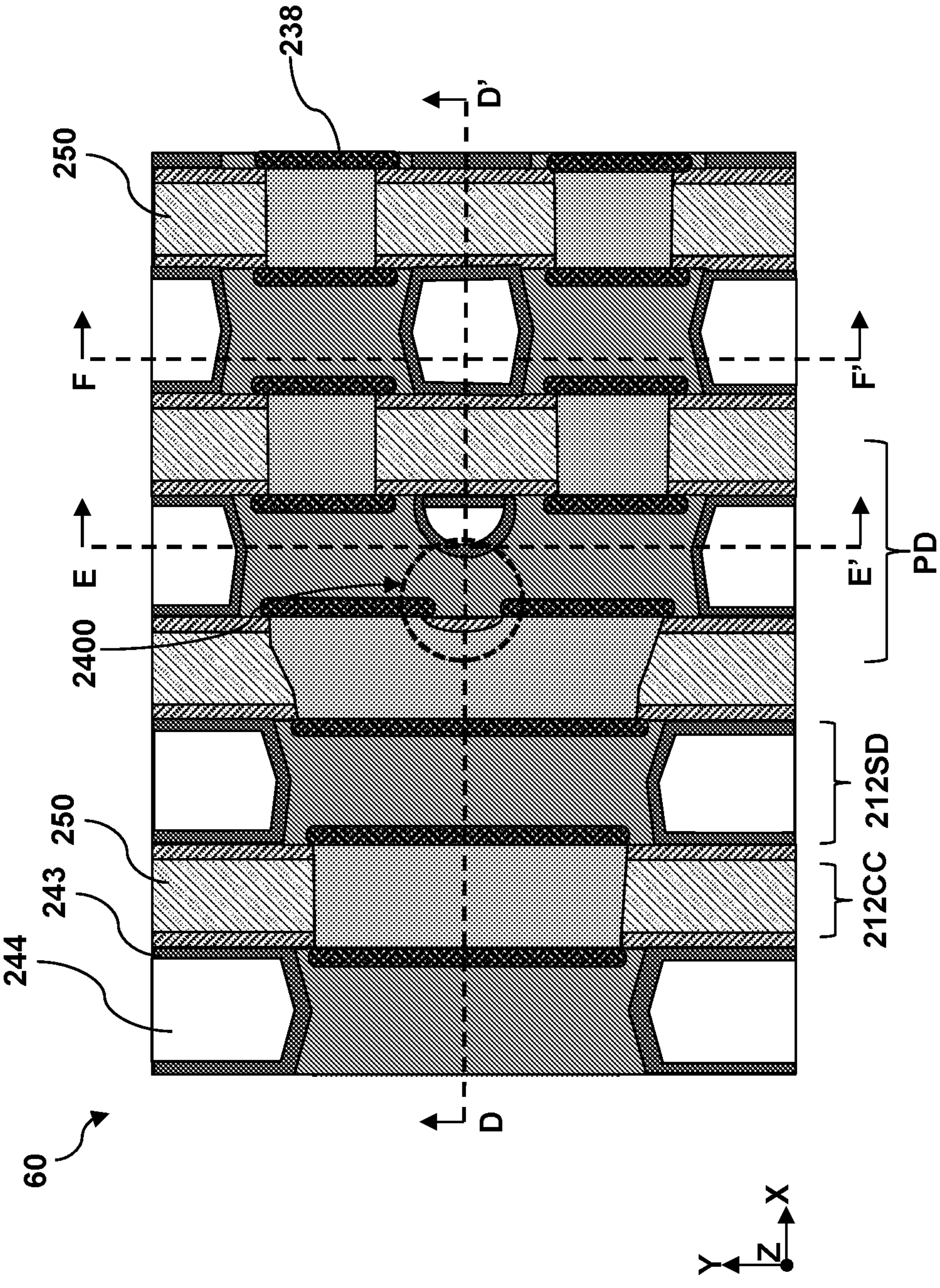
Figure 27:
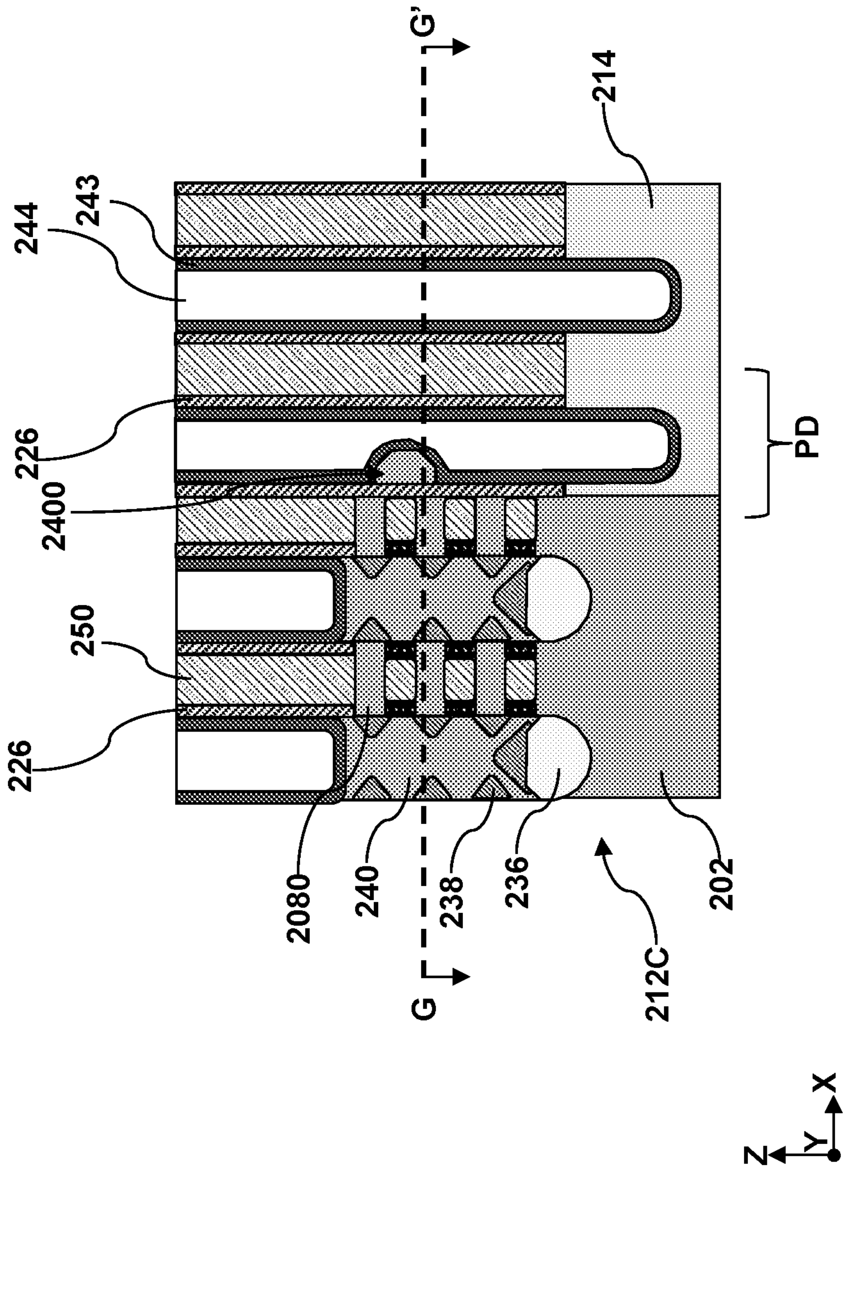

Referring to FIGS. 26 and 27, after the release of the channel members 2080, the gate structure 250 is formed to wrap around each of the channel members 2080. While not explicitly shown, the gate structure 250 includes an interfacial layer interfacing the channel members 2080 and the substrate 202 in the channel region 212CC, a gate dielectric layer over the interfacial layer, and a gate electrode layer over the gate dielectric layer. The interfacial layer may include a dielectric material such as silicon oxide, hafnium silicate, or silicon oxynitride. The interfacial layer may be formed by chemical oxidation, thermal oxidation, atomic layer deposition (ALD), chemical vapor deposition (CVD), and/or other suitable method. The gate dielectric layer may include a high-k dielectric material, such as hafnium oxide. Alternatively, the gate dielectric layer may include other high-K dielectric materials, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HMO), (Ba,Sr)$TiO_3$ (BST), silicon nitride (SiN), silicon oxynitride (SiON), combinations thereof, or other suitable material. The gate dielectric layer may be formed by ALD, physical vapor deposition (PVD), CVD, oxidation, and/or other suitable methods.

The gate electrode layer of the gate structure 250 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a CMP process may be performed to remove excessive metal, thereby providing a substantially planar top surface of the gate structure. The gate structure includes portions that interpose between channel members 2080 in the channel region 212CC.

Figure 28:
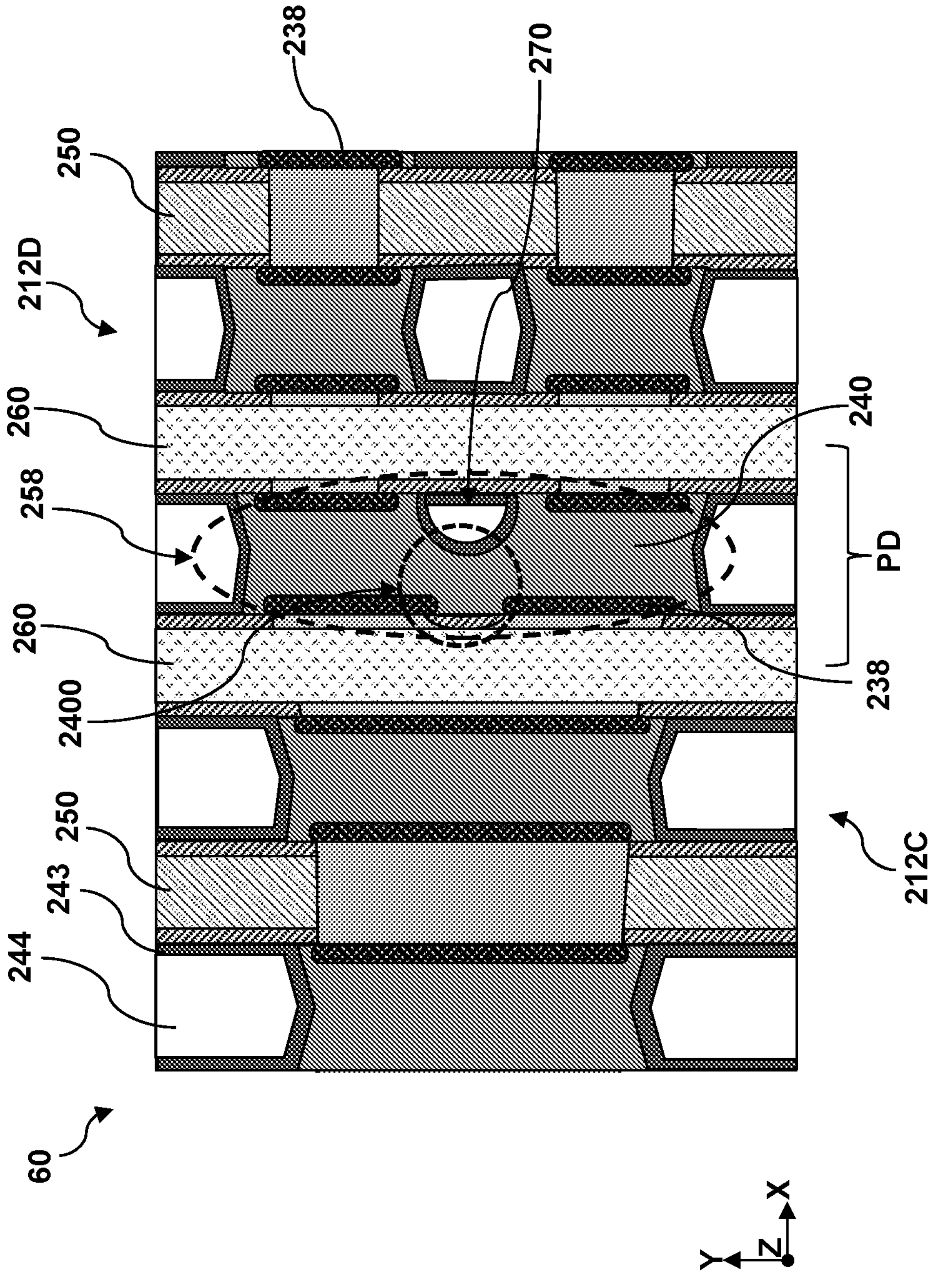

Referring to FIGS. 1 and 28, method 100 includes a block 118 where further processes are performed. Reference is made to FIG. 28, which illustrates the padding portion (PD) that abuts the third section 212C on a first end (the left end surface in FIG. 28) and the fourth sections 212D on an opposing second end (the right end surface in FIG. 28). FIG. 28 represents a top-view cross-section along a horizontal plane that cuts through the merged portion 2400 and one of the channel members 2080 shown in FIG. 27. The horizontal plane is representatively shown as line G-G' in FIG. 27. In some embodiments, the padding portion (PD) is not suitable for formation of a transistor structure as the source/drain features disposed over the padding portion (PD) may merge at the merged portion 2400. For ease of reference, the source/drain feature 242 that is partially merged may be referred to as a transition epitaxial feature 258, which is at least characterized by the merged portion 2400 and the carved-out portion 270. The carved-out portion 270 is filled with the CESL 243 and the ILD layer 244. To isolate the padding portion (PD) from functional transistor structures formed over the third section 212C or the fourth sections 212D, the two gate structures 250 (along with the channel members 2080 thereunder) on both ends of the padding portion (PD) may be anisotropically etched and replaced with two dielectric gate structures 260. The dielectric gate structures 260 may include silicon nitride, silicon oxide, silicon carbide, silicon oxynitride, silicon oxycarbide, or silicon oxycarbonitride. The two dielectric gate structures 260 isolate the source/drain feature in the padding portion (PD) from the channel members in the third section 212C and the fourth section 212D.

Figure 29:
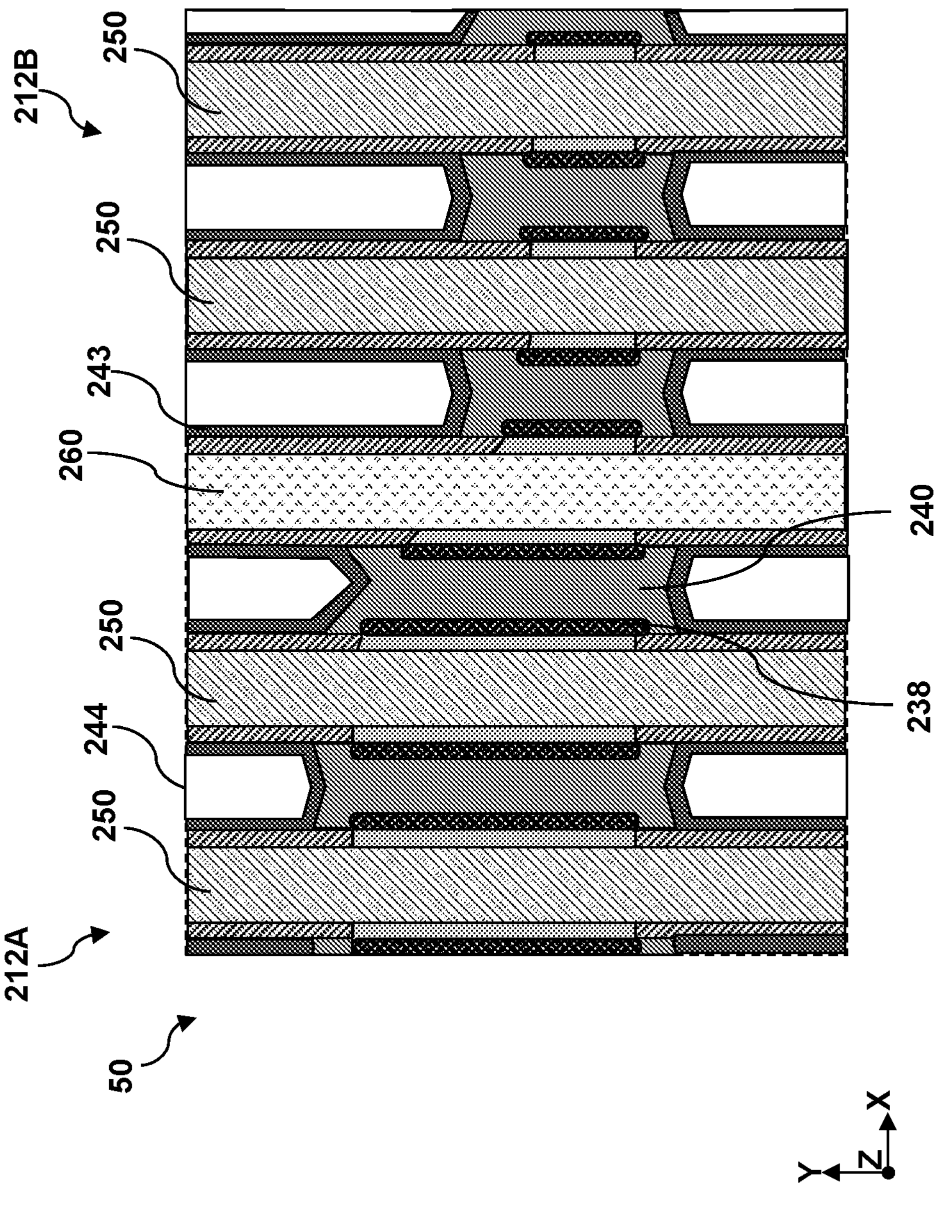

Similarly, when an L-shaped transition portion 50 is implemented, the gate structure 250 that spans across the sloped portion may be removed along the channel members 2080 thereunder and replaced with a dielectric gate structure 260 shown in FIG. 29. As compared to the C-shaped transition portion 60 illustrated in FIG. 28, there is only one dielectric gate structure 260 that cut through the L-shape transition portion 50 and no padding portion PD counterpart is defined on the L-shape transition portion 50. As shown in FIG. 29, along the X direction, one end surface of the dielectric gate structure 260 abuts the first section 212A and the other end surface of dielectric gate structure 260 abuts the second section 212B. In some alternative embodiments not explicitly illustrated in the figures, when the first section 212A is more than twice as wide as the second section 212B (i.e., when the first width W1 is more than twice as the second width W2), the middle sloped portion may be isolated by two dielectric gate structures 260 to form a padding portion (PD).

Figure 30:
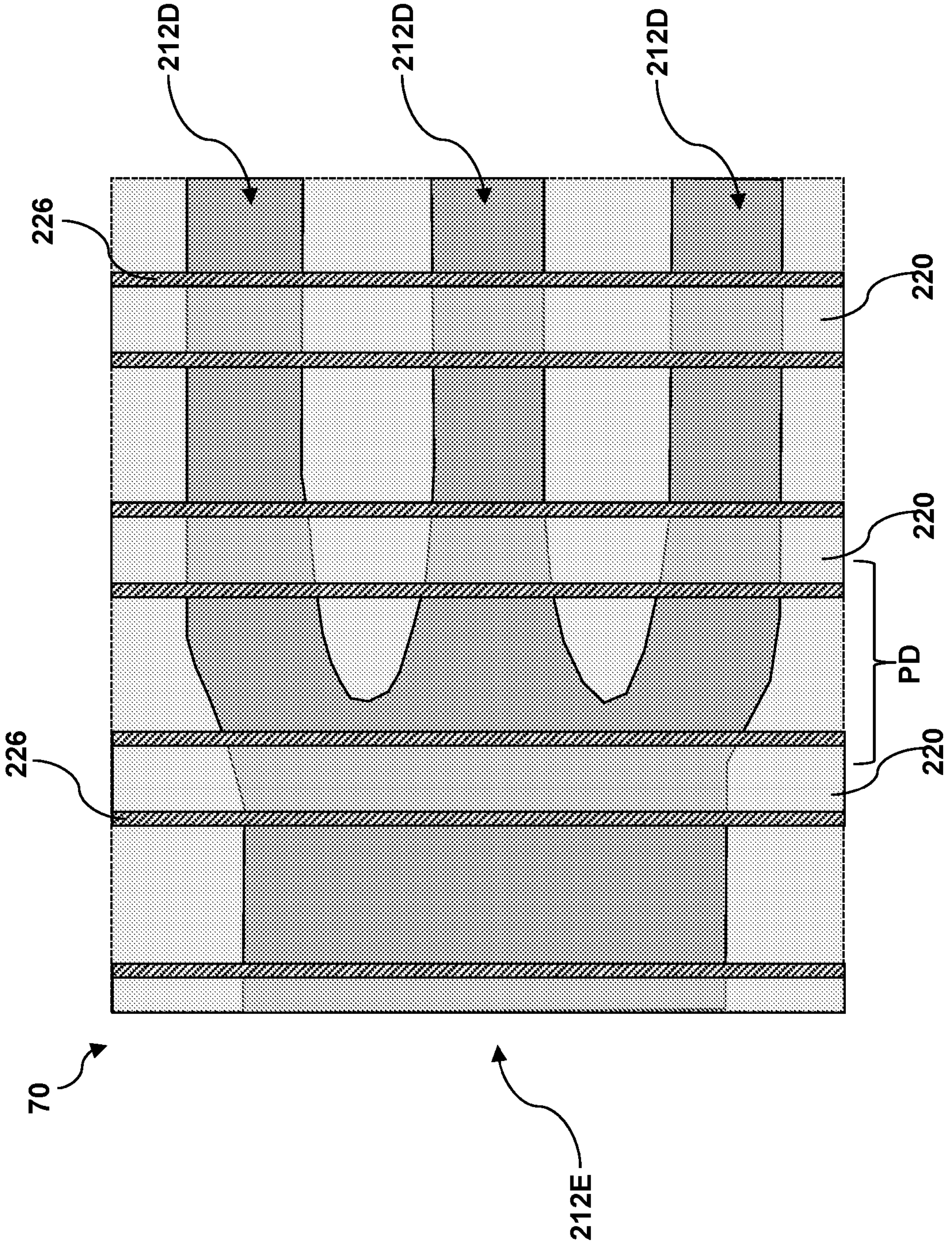
FIG. 30 illustrates a fragmentary top view of an active region for MBC transistors according to an alternative embodiment of the present disclosure.

In addition to the L-shaped transition portion 50 shown in FIGS. 5 and 13 and the C-shaped transition portion 60 shown in FIGS. 6 and 14, the present disclosure also envisions a W-shaped transition 70 shown in FIG. 30. The W-shaped transition 70 in FIG. 30 includes a fifth section 212E and continuously transitions into three fourth sections 212D. Like the C-shaped transition portion 60, the W-shaped transition 70 may also include a padding portion (PD) that will be insulated using dielectric gate structures similar to the dielectric gate structures 260 shown in FIG. 28. As a summary of the illustrated examples, the L-shaped transition portion 50 may be implemented as a buffer zone between one wide active region (i.e., the first section 212A) to one narrow active region (i.e., the second section 212B); the C-shaped transition portion 60 may be implemented as a buffer zone between one wide active region (i.e., the third section 212C) to two narrow active regions (i.e., the two fourth section 212D); and the W-shaped transition 70 may be implemented as a buffer zone between one wide active region (i.e., the fifth section 212E) to three narrow active regions (i.e., the three fourth section 212D). The present disclosure envisions other transitions of different active regions that fall within the spirit of the embodiments illustrated herein.

In one exemplary aspect, the present disclosure is directed to a semiconductor structure. The semiconductor structure includes a dielectric gate structure extending lengthwise along a first direction and including a first sidewall and a second sidewall opposing the first sidewall, a C-shaped epitaxial feature including a first branch and a second branch adjacent the first sidewall as well as a merged portion away from the first sidewall, and a first epitaxial feature and a second epitaxial feature disposed adjacent the second sidewall. When viewed along the first direction, the merged portion has an island-like shape.

In some embodiments, the C-shaped epitaxial feature is disposed over a substrate. Along a second direction perpendicular to a top surface of the substrate, a thickness of the merged portion is smaller than a thickness of the first branch. In some implementations, the semiconductor structure further includes a contact etch stop layer (CESL) disposed over the C-shaped epitaxial feature, the first epitaxial feature, and the second epitaxial feature, and a dielectric layer disposed over the CESL. In some instances, the C-shaped epitaxial feature and the first sidewall define a carved-out portion disposed between the first branch and the second branch along the first direction. In some embodiments, the carved-out portion includes the CESL and the dielectric layer. In some implementations, the semiconductor structure further includes a first stack of nanostructures in contact with a sidewall of the first epitaxial feature such that the first epitaxial feature is sandwiched between the dielectric gate structure and the first stack of nanostructures, and a second stack of nanostructures in contact with a sidewall of the second epitaxial feature such that the second epitaxial feature is sandwiched between the dielectric gate structure and the second stack of nanostructures. In some embodiments, the semiconductor structure further includes a metal gate structure wrapping around each of the first stack of nanostructures and each of the second stack of nanostructures.

In another exemplary aspect, the present disclosure is directed to a semiconductor structure. The semiconductor structure includes a first stack of nanostructures extending lengthwise along a first direction, each of the first stack of nanostructures having a first width along a second direction perpendicular to the first direction, a second stack of nanostructures extending lengthwise along the first direction, each of the second stack of nanostructures having a second width along the second direction, a third stack of nanostructures extending lengthwise along the first direction, each of the third stack of nanostructures having the second width along the second direction, and an epitaxial feature sandwiched between the first stack of nanostructures and the second stack of nanostructures as well as between the first stack of nanostructures and the third stack of nanostructures along the first direction. The first width is greater than the second width.

In some embodiments, the epitaxial feature includes a first end adjacent the first stack of nanostructures and a second end adjacent the second stack of nanostructures and the third stack of nanostructures. The first end has a third width along the second direction, the second end has a fourth width along the second direction, and the fourth width is greater than the third width. In some instances, the semiconductor structure further includes a first dielectric gate structure extending along the second direction and disposed between the first stack of nanostructures and the epitaxial feature. In some implementations, the semiconductor structure further includes a second dielectric gate structure extending along the second direction and disposed between the second stack of nanostructures and the epitaxial feature. The second dielectric gate structure is disposed between the third stack of nanostructures and the epitaxial feature. In some embodiments, the first dielectric gate structure and the second dielectric gate structure include silicon oxide, silicon nitride, silicon oxynitride, silicon oxycarbonitride, or a combination thereof. In some instances, the semiconductor structure further includes a first metal gate structure wrapping around each of the first stack of nanostructures. The first dielectric gate structure is disposed between the first metal gate structure and the epitaxial feature. In some embodiments, the semiconductor structure further includes a second metal gate structure wrapping around each of the second stack of nanostructures and each of the third stack of nanostructures. The second dielectric gate structure is disposed between the second metal gate structure and the epitaxial feature. In some implementations, the first metal gate structure and the second metal gate structure include a high-k gate dielectric layer and a metal layer.

In yet another exemplary aspect, the present disclosure is directed to a method. The method includes forming, over a substrate, a stack that includes first semiconductor layers interleaved by second semiconductor layers, and patterning the stack and a portion of the substrate to form a fin-like structure extending lengthwise along a first direction. The fin-like structure includes a first section having a first width along a second direction perpendicular to the first direction, a second section having a second width along the second direction and a third section having the second width along the second direction. The first width is different from the second width. The first section continuously transitions to the second section and the third section.

In some embodiments, the first semiconductor layers include silicon and the second semiconductor layers include silicon germanium. In some implementations, the method further includes forming a first dummy gate stack over the first section and a second dummy gate stack over the second section and the third section, depositing at least one gate spacer layer over the first dummy gate stack and the second dummy gate stack, etching the fin-like structure between the first dummy gate stack and the second dummy gate stack to form a trench, forming an epitaxial feature in the trench, depositing a dielectric layer over the epitaxial feature, selectively removing the second semiconductor layers to release the first semiconductor layers in the first section as first channel members, the first semiconductor layers in the second section as second channel members, and the first semiconductor layers in the third section as third channel members, and forming a first gate structure to wrap around each of the first channel members, a second gate structure to wrap around each of the second channel member and the third channel members. In some embodiments, the method further includes, after the etching, selectively and partially recessing the second semiconductor layers exposed in the trench to form inner spacer recesses, and forming inner spacer features in the inner spacer recesses. In some embodiments, the method further includes replacing the first gate structure with a first dielectric gate structure and replacing the second gate structure with a second dielectric gate structure.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:

a dielectric gate structure extending lengthwise along a first direction and comprising a first sidewall and a second sidewall opposing the first sidewall;

a C-shaped epitaxial feature comprising a first branch and a second branch adjacent the first sidewall as well as a merged portion away from the first sidewall; and a first epitaxial feature and a second epitaxial feature disposed adjacent the second sidewall, wherein the first epitaxial feature and the second epitaxial feature are spaced apart along the first direction, wherein the C-shaped epitaxial feature comprises a C-shape when viewed along a second direction perpendicular to the first direction, wherein the first epitaxial feature is spaced apart from the second sidewall by a first semiconductor layer, wherein the second epitaxial feature is spaced apart from the second sidewall by a second semiconductor layer, wherein, when viewed along the first direction, the merged portion has an island- like shape.

2. The semiconductor structure of claim 1, wherein the C-shaped epitaxial feature is disposed over a substrate, wherein, along the second direction, a thickness of the merged portion is smaller than a thickness of the first branch, wherein the second direction is perpendicular to a top surface of the substrate.

3. The semiconductor structure of claim 1, further comprising:

a contact etch stop layer (CESL) disposed over the C-shaped epitaxial feature, the first epitaxial feature, and the second epitaxial feature; and a dielectric layer disposed over the CESL.

4. The semiconductor structure of claim 3, wherein the C-shaped epitaxial feature and the first sidewall define a carved-out portion disposed between the first branch and the second branch along the first direction, wherein the carved-out portion is spaced apart from the first sidewall by a gate spacer, wherein the gate spacer comprises silicon carbonitride, silicon oxycarbide, silicon oxycarbonitride, or silicon nitride, wherein the first semiconductor layer and the second semiconductor layer is spaced apart from one another along the first direction by a portion of the gate spacer.

5. The semiconductor structure of claim 4, wherein the carved-out portion is filled with the CESL and the dielectric layer.

6. The semiconductor structure of claim 1, further comprising:

a first stack of nanostructures in contact with a sidewall of the first epitaxial feature such that the first epitaxial feature is sandwiched between the dielectric gate structure and the first stack of nanostructures; and a second stack of nanostructures in contact with a sidewall of the second epitaxial feature such that the second epitaxial feature is sandwiched between the dielectric gate structure and the second stack of nanostructures.

7. The semiconductor structure of claim 6, further comprising:

a metal gate structure wrapping around each of the first stack of nanostructures and each of the second stack of nanostructures.

8. A semiconductor structure, comprising:

a first stack of nanostructures extending lengthwise along a first direction, each of the first stack of nanostructures having a first width along a second direction perpendicular to the first direction;

a second stack of nanostructures extending lengthwise along the first direction, each of the second stack of nanostructures having a second width along the second direction;

a third stack of nanostructures extending lengthwise along the first direction, each of the third stack of nanostructures having the second width along the second direction; and an epitaxial feature continuously extending from between the first stack of nanostructures and the second stack of nanostructures along the first direction to between the first stack of nanostructures and the third stack of nanostructures along the first direction, wherein the epitaxial feature comprises two branches and a carved-out portion such that the epitaxial feature has a C-shape when viewed along a vertical direction perpendicular to the first direction and the second direction, wherein the first width is greater than the second width.

9. The semiconductor structure of claim 8, wherein the epitaxial feature comprises a first end adjacent the first stack of nanostructures and a second end adjacent the second stack of nanostructures and the third stack of nanostructures, wherein the first end has a third width along the second direction, wherein the second end has a fourth width along the second direction, wherein the fourth width is greater than the third width.

10. The semiconductor structure of claim 8, further comprising:

a first dielectric gate structure extending along the second direction and disposed between the first stack of nanostructures and the epitaxial feature, wherein the first dielectric gate structure is spaced apart from the epitaxial feature, along the first direction, by a semiconductor layer and a gate spacer.

11. The semiconductor structure of claim 10, further comprising:

a second dielectric gate structure extending along the second direction and disposed between the second stack of nanostructures and the epitaxial feature, wherein the second dielectric gate structure is disposed between the third stack of nanostructures and the epitaxial feature.

12. The semiconductor structure of claim 11, wherein the first dielectric gate structure and the second dielectric gate structure comprise silicon oxide, silicon nitride, silicon oxynitride, silicon oxycarbonitride, or a combination thereof.

13. The semiconductor structure of claim 11, further comprising:

a first metal gate structure wrapping around each of the first stack of nanostructures, wherein the first dielectric gate structure is disposed between the first metal gate structure and the epitaxial feature.

14. The semiconductor structure of claim 13, further comprising:

a second metal gate structure wrapping around each of the second stack of nanostructures and each of the third stack of nanostructures, wherein the second dielectric gate structure is disposed between the second metal gate structure and the epitaxial feature.

15. The semiconductor structure of claim 14, wherein the first metal gate structure and the second metal gate structure comprise a high-k gate dielectric layer and a metal layer.

16. A semiconductor structure, comprising:

a substrate;

a first dielectric gate structure over the substrate along a vertical direction perpendicular to a top surface of the substrate and extending lengthwise along a first direction perpendicular to the vertical direction and comprising a first sidewall and a second sidewall, the second sidewall opposing the first sidewall along a second direction perpendicular to the first direction and the vertical direction;

an epitaxial feature adjacent the first sidewall; and a C-shaped epitaxial feature adjacent the second sidewall and comprising a first branch, a second branch and a merged portion between the first branch and the second branch along the first direction, wherein the merged portion is spaced apart from the second sidewall by a gate spacer, wherein the epitaxial feature comprises a first width along the first direction, wherein the C-shape epitaxial feature comprises a second width along the first direction, wherein the second width is greater than the first width, wherein, when viewed along the first direction, the merged portion has an island-like shape.

17. The semiconductor structure of claim 16, wherein the C-shaped epitaxial feature is disposed over the substrate, wherein, along the vertical direction, a thickness of the merged portion is smaller than a thickness of the first branch.

18. The semiconductor structure of claim 16, further comprising:

a second dielectric gate structure extending lengthwise along the first direction and adjacent the first branch and the second branch of the C-shaped epitaxial feature;

a contact etch stop layer (CESL) disposed over the epitaxial feature and the C-shaped epitaxial feature; and a dielectric layer disposed over the CESL.

19. The semiconductor structure of claim 18, wherein the C-shaped epitaxial feature and the second dielectric gate structure define a carved-out portion disposed between the first branch and the second branch along the first direction.

20. The semiconductor structure of claim 19, wherein the carved-out portion is filled with the CESL and the dielectric layer.

* * * * *